United States Patent [19]
Asakura

[11] Patent Number: 5,715,189
[45] Date of Patent: Feb. 3, 1998

[54] SEMICONDUCTOR MEMORY DEVICE HAVING HIERARCHICAL BIT LINE ARRANGEMENT

[75] Inventor: Mikio Asakura, Hyogo, Japan

[73] Assignee: Mitsubishi Denki Kabushiki Kaisha, Tokyo, Japan

[21] Appl. No.: 614,567

[22] Filed: Mar. 13, 1996

Related U.S. Application Data

[63] Continuation of Ser. No. 226,485, Apr. 12, 1994, abandoned.

[30] Foreign Application Priority Data

Apr. 13, 1993 [JP] Japan .................... 5-085850

[51] Int. Cl.$^6$ .................................... G11C 5/10
[52] U.S. Cl. .......................... 365/72; 365/51; 365/63; 365/208; 365/203; 365/190; 365/205; 365/210
[58] Field of Search .................... 365/207, 208, 365/190, 203, 205, 210, 51, 63, 72

[56] References Cited

U.S. PATENT DOCUMENTS

| | | | |
|---|---|---|---|
| 4,807,194 | 2/1989 | Yamada et al. | 365/51 |
| 4,807,195 | 2/1989 | Busch et al. | 365/207 |
| 4,916,667 | 4/1990 | Miyabayashi et al. | 365/210 |
| 4,920,517 | 4/1990 | Yamauchi et al. | 365/51 |
| 4,926,382 | 5/1990 | Sakui et al. | 365/203 |
| 4,970,685 | 11/1990 | Koyanagi | 365/51 |
| 5,274,598 | 12/1993 | Fujii | 365/205 |
| 5,363,331 | 11/1994 | Matsui et al. | 365/230.03 |
| 5,386,394 | 1/1995 | Kawahara et al. | 365/208 |

FOREIGN PATENT DOCUMENTS 6-349267  12/1994  Japan.

OTHER PUBLICATIONS

A 34-NS 16-MB Dram With Controllable Voltage Down-Converter, Hideto Hidaka et al., Jul. 102, IEEE Journal of Solid-State Circuits, vol. 27, pp. 1020-1027.

3-Dimensional Stacked Capacitor Cell For 16M and 64M Drams, T. Ema et al., IEDM Technical Digest Dec., 1988. p. 592.

Fam 19.3: A 1MB CMOS DRAM With Design-For-Test Functions, Joseph Neal et al., ISSCC 86, IEEE International Solid-State Circuits Conference, p. 264 (ISSCC).

"NAND-Structured Cell Tecnologies for 256Mb DRAMs", Yamada et al., *Technical Report of IEICE SDM94-18, ICD94-29,* (1994-05) pp. 13-18.

"NAND-Structured Cell Technologies for Low Cost 256Mb DRAMs", *IEDM 93*, pp. 643-646, T. Hamamoto et al., Dec. 1993.

*Primary Examiner*—Joseph E. Clawson, Jr.
*Attorney, Agent, or Firm*—Lowe, Price, LeBlanc & Becker

[57] ABSTRACT

The DRAM includes a plurality of main bit line pairs, a plurality of sense amplifiers, a plurality of word lines, a plurality of sub bit lines, a plurality of transfer gates, and a plurality of memory cells. The plurality of sub bit line pairs are arranged along each main bit line pair. The parasitic capacitance per unit length of a main bit line pair is at most ¼ that of a sub bit line pair. Each transfer gate connects one main bit line and one sub bit line in response to a prescribed control signal. Thus, sufficiently large potential difference is generated between the main bit lines, and therefore the sense amplifier can surely amplify the potential difference.

4 Claims, 18 Drawing Sheets

SEMICONDUCTOR MEMORY DEVICE HAVING HIERARCHICAL BIT LINE ARRANGEMENT

This application is a continuation of application Ser. No. 08/226,485 filed Apr. 12, 1994, now abandoned.

BACKGROUND OF THE INVENTION

1. Field of the Invention

The present invention relates generally to semiconductor memory devices, and more specifically, to Dynamic Random Access Memories (hereinafter referred to as "DRAMs") having hierarchical bit line arrangement.

2. Description of the Background Art

FIG. 16 is a block diagram showing the entire structure of a conventional DRAM. Such a DRAM is disclosed for example in IEEE Journal of Solid-State Circuits, vol. 27, No. 7, p. 1020. Referring to FIG. 16, the DRAM includes blocks B1 to B32, sense amplifier trains S1 to S34, row decoders RD, and column decoders CD.

FIG. 17 is an interconnection diagram showing in detail part of the DRAM shown in FIG. 16. Referring to FIG. 17, each block B1 to B32 includes 1024 bit line pairs BL, /BL arranged in columns, 256 word lines WL arranged in rows, and memory cells MC connected at crossing points of a word line and one bit line BL or /BL.

Each sense amplifier train S1 to S34 includes a plurality of sense amplifiers SA. Each sense amplifier SA includes two N channel MOS transistors cross-coupled between bit line pair BL, /BL, and two similarly cross-coupled P channel MOS transistors.

The DRAM employs shared sense amplifier arrangement. More specifically, one sense amplifier SA is connected to two bit line pairs BL, /BL on adjacent opposing blocks in blocks B1 to B32 through two N channel MOS transistor pairs Tb, /Tb. These transistor pairs Tb and /Tb have their gate electrodes connected to block select lines SS. In FIG. 17, if, for example, block B1 on the left side is selected, a block select line SS2 on the left side in block B2 on the right side is pulled to L level. Meanwhile, if block B2 on the right side is selected, a block select line SS1 on the right side in block B1 on the left side is pulled to L level.

In the DRAM, sense amplifiers SA are alternately arranged on opposing sides of blocks B1 to B32. Accordingly, the pitch of sense amplifiers SA is two times wider than that of bit line pairs BL, $\overline{BL}$.

Each sense amplifier train S1 to S34 further includes an equalize circuit 10, a precharge circuit 12, and an input/output circuit 14. Equalize circuit 10 includes an N channel MOS transistor Te, short-circuits bit line pair BL, /BL to equalize the potentials of the bit line pair BL, /BL. Precharge circuit 12 includes N channel MOS transistors Tp and /Tp, and precharges bit line pair BL, /BL to an intermediate potential Vcc/2. Input/output circuit 14 which includes N channel MOS transistors Ti and /Ti externally outputs potentials produced on bit line pairs BL, /BL through an input/output line pair IO, /IO, and supplies bit line pairs BL, /BL with potentials externally input through input/output line pair IO, /IO. The gate electrodes of these transistors Ti and /Ti are connected to a column select line CS. Column select line CS is selectively pulled to H level by column decoder CD.

FIG. 18 is an interconnection diagram showing in detail memory cell MC shown in FIG. 17 and its periphery.

Referring to FIG. 18, memory cell MC includes a transfer gate TG which is controlled by a word line WL, and a memory cell capacitor Cs storing the data.

Bit lines BL, /BL each have parasitic capacitance Cb. Parasitic capacitance Cb is in proportion with the number of memory cells MC connected to one bit line BL or /BL. This is because the larger the number of memory cells MC, the longer should be the length of bit line BL, or /BL.

Now, reading operation of the DRAM will be briefly described.

The storage node potential of memory cell capacitor Cs is pulled to power supply potential Vcc or ground potential GND in order that memory cell MC stores 1 bit data.

Before reading operation, an equalize line EQ is set to H level, bit line pair BL, /BL are precharged to intermediate potential Vcc/2, and the potentials of bit line pair BL, /BL are equalized. In reading, an equalize line EQ is pulled down to L level, then word line WL is pulled to H level. Therefore transfer gate TG conducts, and data stored at its memory capacitor Cs is read out onto bit line BL through transfer gate TG.

As described above, when the data of memory cell MC is read out onto one bit line BL, the potential difference |ΔV| expressed as follows is generated between bit lines BL, /BL.

$$|\Delta V| = (Vcc/2)/(Cb/Cs+1)$$

where Cb represents parasitic capacitance for one bit line, and Cs represents the capacitance of a memory capacitor.

Potential difference |ΔV| will be amplified by sense amplifier SA. If the potential difference |ΔV| is too small, however, sense amplifier SA cannot fully amplify potential difference |ΔV|.

For example in a DRAM having 16M bit storage capacity, Cb/Cs is about "10", and therefore at power supply potential Vcc=3.3 V, potential difference |ΔV| will be as small as 150 mV. Accordingly, for stable operation of the DRAM, the value of parasitic capacitance Cb should be as small as possible.

In view of the foregoing, a conventional DRAM is formed of 32 blocks B1 to B32 as illustrated in FIG. 16. More specifically, if the length of one bit line pair BL or /BL is longer, the number of trains of sense amplifiers can be smaller than 34. Prolonging bit line pair BL, /BL however increases the value of its parasitic capacitance Cb. Therefore, in a conventional DRAM, even if the number of trains of sense amplifiers is increased, the length of bit line pair BL, /BL is kept at only about a level at which enough potential difference |ΔV| is obtained.

Accordingly, while storage capacity has increased from 1M bit to 4M bit, 16M bit, and then to 64M bit one generation after another, the number of memory cells MC connected to one bit line BL or /BL has been fixed at 128 with few exceptions.

Meanwhile, the size of memory cell MC is reduced by means of three-dimensional structure or the like, but the size of each sense amplifier is not reduced as much as memory cell MC. Accordingly, as storage capacity increases, the area occupied by each sense amplifier in the entire chip increases. This impedes implementation of 256M bit and thus 1 G bit DRAMs.

In addition, as storage capacity increases and the size of elements is further reduced, the possibility of generation of defects, dust or the like increases and yield drops as a result. Spare memory cells are arranged in a redundant manner for a DRAM as countermeasure. If a defective memory cell is included in a manufactured DRAM, the defective memory cell is replaced with a spare memory cell.

In a DRAM having a number of spare memory cells arranged in a redundant manner together with a number of spare word lines, if a regular word line is disconnected or short-circuited and therefore data cannot be read out from a regular memory cell selected by the word line, the word line will be replaced with a spare word line. More specifically, a fuse circuit or the like will pull the spare word line to H level through programming in response to an address for selecting the regular word line.

In a DRAM, when word line WL is pulled to H level and data is read out onto bit line pair BL, /BL, sense amplifier SA is activated and amplifies the read out data. At the time, data in memory cell MC is destroyed, and therefore the amplified data is rewritten in the memory cell MC.

Accordingly, if a regular word line WL in a block B1 is defective, a spare word line provided in the same block B1 replaces the regular word line WL. In order that the regular word line WL in block B1 is replaced with a spare word line provided in any of blocks B2 to B32, a sense amplifier SA in that block should be activated. Accordingly, very much complicated control will be necessary to replace a regular word line turned into defective in one block with a spare word line in another block.

For example, 256 regular word lines and two spare word lines are usually provided in one block. A defective word line is replaced with a spare word line in the same block. For two blocks, for example, four spare word lines are provided all together. In such a case, if three regular word lines become defective in one block, the DRAM which has four spare word lines cannot be repaired.

SUMMARY OF THE INVENTION

The present invention is directed to a solution to the above-described problems, and it is an object of the invention to provide a semiconductor memory device having a reduced size.

Another object of the invention is to provide a semiconductor memory device having larger storage capacity.

Yet another object of the invention is to provide a semiconductor memory device having a reduced size and capable of accurately reading out data.

A still further object of the invention is to provide a semiconductor memory device having large storage capacity and permitting accurate data reading.

A still further object of the invention is to provide a semiconductor memory device having a reduced size and capable of operating at a sufficiently high speed.

A still further object of the invention is to provide a semiconductor memory device having large storage capacity and capable of operating at a sufficiently high speed.

A still further object of the invention is to provide a semiconductor memory device which can be manufactured at high yield.

An additional object of the invention is to provide a semiconductor memory device which can be manufactured at high yield and has simple control circuitry.

Another additional object of the invention is to provide a semiconductor memory device which can be quickly tested.

A semiconductor memory device according to-one aspect of the invention includes a plurality of main bit line pairs, a plurality of sense amplifiers, a plurality of word lines, a plurality of sub bit lines, a plurality of switching elements, and a plurality of memory cells. The plurality of main bit line pairs are arranged in columns. The plurality of sense amplifiers each amplify the potential difference between the main bit lines of corresponding one main bit line pair among the plurality of main bit line pairs. The plurality of word lines are arranged in rows. The plurality of sub bit lines are arranged along each of the plurality of main bit line pairs and have at least four times as large parasitic capacitance per unit length as the plurality of main bit line pairs. The plurality of switching elements connect one main bit line of a corresponding one main bit line pair among the plurality of main bit line pair and a corresponding one sub bit line among the plurality of sub bit lines, in response to a prescribed control signal. The plurality of memory cells each store the data of one sub bit line therein or has data stored therein read out onto one sub bit line in response to the potential of a corresponding one word line among the plurality of word lines.

According to the invention, sufficiently large potential difference is advantageously generated between main bit lines, because the parasitic capacitance per unit length of a main bit line pair is at most ¼ the parasitic capacitance per unit length of a sub bit line.

A semiconductor memory device according to another aspect of the invention includes a plurality of main bit line pairs, a plurality of sense amplifiers, a plurality of word lines, a plurality of sub bit lines, a plurality of switching elements, and a plurality of memory cells. The plurality of sub bit lines are arranged along each of the plurality of main bit line pairs. The plurality of switching elements are arranged in a hound's-tooth manner.

A main advantage brought about by the present invention is that the plurality of switching elements are arranged in a hound's tooth manner, and therefore the pitch of switching elements is relaxed.

A semiconductor memory device according to yet another aspect of the invention includes a plurality of main bit line pairs, a plurality of sense amplifiers, a plurality of word lines, a plurality of sub bit lines, a plurality of switching elements, a plurality of memory cells, a plurality of first transistor pairs, and a plurality of second transistor pairs. The plurality of sub bit lines are provided along each of the plurality of main bit line pairs. Corresponding two main bit line pairs among the plurality of main bit line pairs are provided on opposing sides of a corresponding one of the plurality of sense amplifiers. The plurality of first transistor pairs each connect one of the two main bit line pairs and one sense amplifier in response to a prescribed first select signal. The plurality of second transistor pairs each connect the other of the two main bit line pair and one sense amplifier in a complementary manner with respect to the plurality of second transistor pairs in response to a prescribed second select signal.

Another main advantage brought about by the present invention is that a sense amplifier is shared by two main bit line pairs, and therefore the number of necessary sense amplifiers is reduced.

A semiconductor memory device according to a still further aspect of the invention includes a plurality of main bit line pairs, a plurality of sense amplifiers, a plurality of word lines, a plurality of sub bit lines, a plurality of switching elements, and a plurality of memory cells. The plurality of sub bit lines are arranged along each of the plurality of main bit line pairs. The plurality of sense amplifiers are arranged in a hound's tooth manner.

Since sense amplifiers are arranged in a hound's tooth manner, the pitch of sense amplifiers is relaxed.

A semiconductor memory device according to a still further aspect of the invention includes a plurality of main bit line pairs, a plurality of sense amplifiers, a plurality of word lines, a plurality of sub bit lines, a plurality of switching elements, a plurality of memory cells, a plurality of spare word lines, a plurality of spare sub bit lines, a plurality of spare switching elements, and a plurality of spare memory cells. The plurality of sub bit lines are arranged along each of the plurality of main bit line pairs. The plurality of spare word lines are arranged in rows. The plurality of spare sub bit lines are arranged in columns along the plurality of main bit line pairs. The plurality of switching elements each connect one main bit line of a corresponding one main bit line pair among the plurality of main bit line pair and a corresponding one spare sub bit line of the plurality of spare sub bit lines in response to a prescribed spare control signal.

Since sub bit line pairs and a spare sub bit line pair are selectively connected to one main bit line pair, if any one spare word line replaces one defective word line, then the same one sense amplifier connected to the one main bit line pair is activated. Therefore, such semiconductor memory device does not require a complicated control of activating another sense amplifier when the spare word line replaces the defective word line.

A semiconductor memory device according to a still further aspect of the invention includes a plurality of main bit line pairs, a plurality of sense amplifiers, a plurality of word lines, a plurality of sub bit lines, a plurality of switching elements, a plurality of memory cells, and a plurality of comparison circuits. The plurality of sub bit lines are arranged along each of the plurality of main bit line pairs. The plurality of comparison circuits each compare the potentials of one main bit line pair of corresponding two main bit line pairs of the plurality of main bit line pairs and the potentials of the other main bit line pair correspondingly.

Since the potentials of one main bit line pair are compared to the potentials of the other main bit line pair correspondingly, the normality/abnormality of the semiconductor device can be quickly determined.

A semiconductor memory device according to a still further aspect of the invention includes a plurality of main bit line pairs, a plurality of sense amplifiers, a plurality of word lines, a plurality of sub bit lines, a plurality of switching elements, a plurality of memory cells and a plurality of dummy word lines. The plurality of sub bit lines are arranged along each of the plurality of main bit line pairs. The plurality of dummy word lines are arranged in rows between the plurality of sub bit lines and supplied with prescribed potentials.

Since a dummy word line is provided between sub bit lines and supplied with a prescribed potential, mutual data leakage between sub bit lines can advantageously be prevented.

A semiconductor memory device according to an additional aspect of the invention includes a plurality of main bit line pairs, a plurality of sense amplifiers, a plurality of word lines, a plurality of sub bit lines, a plurality of switching elements, a plurality of memory cells, and a plurality of equalize circuits. The plurality of sub bit lines are arranged along each of the plurality of main bit line pairs. The plurality of equalize circuits each connect one sub bit line of corresponding two sub bit lines of the plurality of sub bit lines and the other sub bit line.

Since one sub bit line and the other sub bit line are connected for equalization, the operating speed can advantageously be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of semiconductor memory devices according to the present invention will be described in detail in conjunction with the accompanying drawings.

[Embodiment 1]

Figure 1:
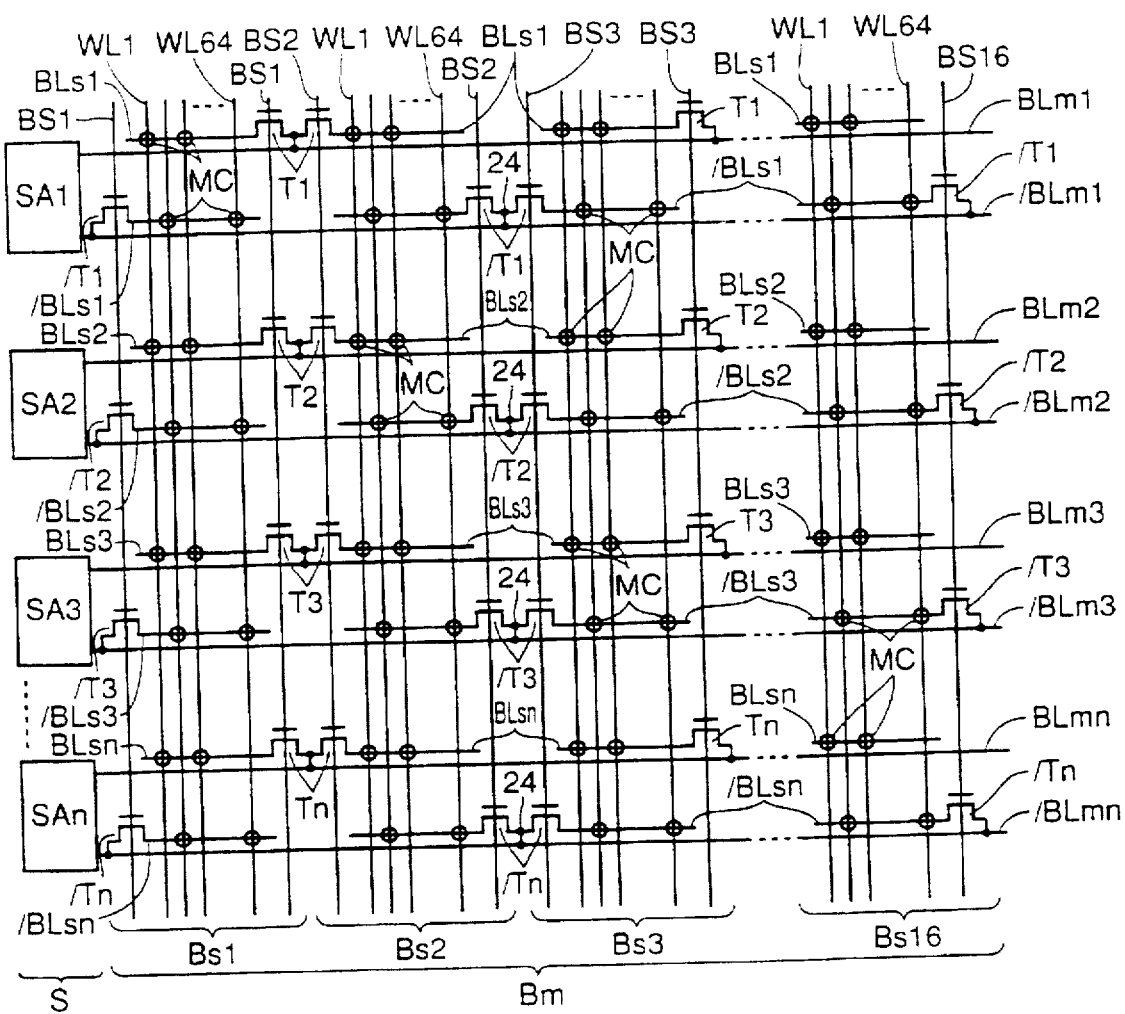
FIG. 1 is an interconnection diagram showing part of a DRAM according to Embodiment 1 according to the invention.

FIG. 1 is an interconnection diagram showing part of a DRAM according to Embodiment 1 of the present invention. Referring to FIG. 1, the DRAM includes a plurality of main bit line pairs BLm, /BLm, a plurality of sense amplifiers SA, a plurality of word lines WL, a plurality of sub bit line pairs BLs, /BLs, a plurality of transfer gates T and /T, a plurality of memory cells MC.

Figure 2:
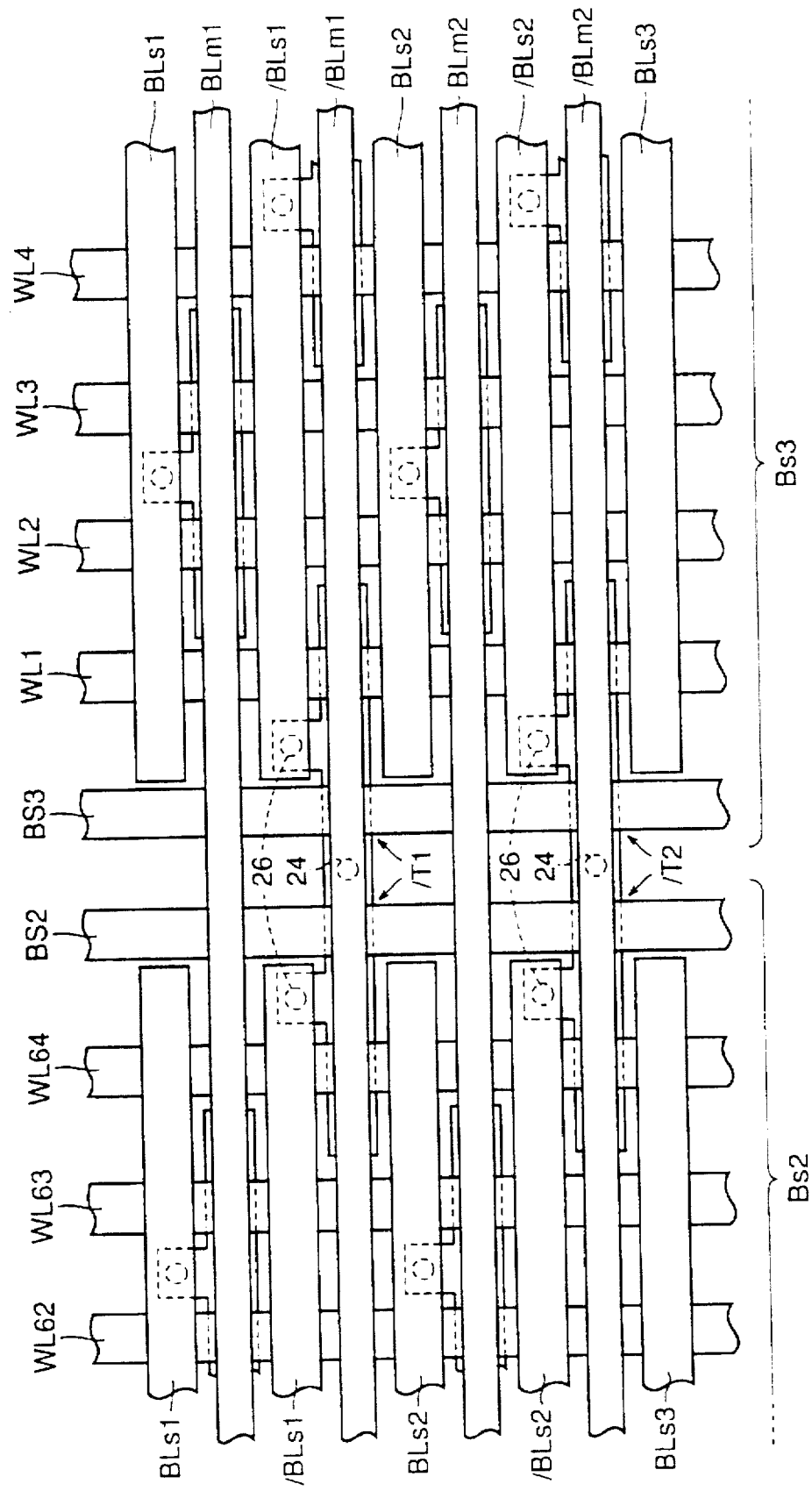
FIG. 2 is a plan view more specifically showing part of the DRAM shown in FIG. 1.

FIG. 2 is a plan view more specifically showing part of the DRAM shown in FIG. 1.

Referring to FIGS. 1 and 2, main bit line pairs BLm, /BLm are provided along the direction of rows. Each sense amplifier SA is connected to each main bit line pair BLm, /BLm, and amplifies the potential difference between one main bit line BLm and the other main bit line /BLm. Word lines WL are arranged in rows. Along each main bit line pair BLm, /BLm, 16 sub bit line pairs BLs, /BLs are arranged.

Sub bit line pair BLs, /BLs has parasitic capacitance cbs per unit length at least four times as large as the parasitic capacitance cbm per unit length of main bit line pair BLm, /BLm. More specifically, the parasitic capacitance cbm per unit length of main bit line pair BLm, /BLm corresponds to at most the ¼ the parasitic capacitance cbs per unit length of sub bit line pair BLs, /BLs.

Each transfer gate T, /T is connected between one main bit line BLm or /BLm and one sub bit line BLs or /BLs, and has a gate electrode connected to a sub block select line BS. Accordingly, each transfer gate T, /T connects one main bit line BLm or /BLm and one sub bit line BLs or /BLs, in response to a prescribed control signal supplied from sub block select line BS.

Figure 3:
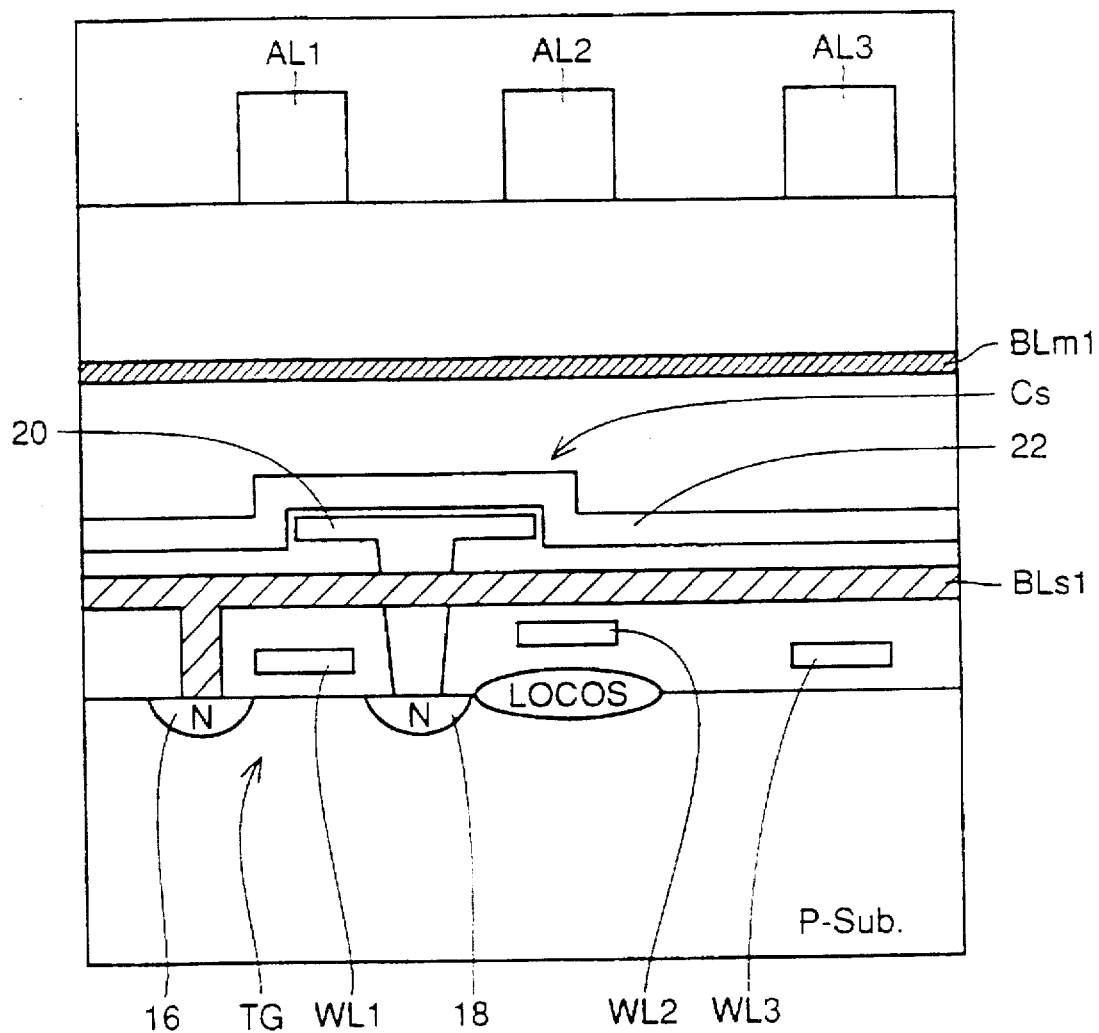
FIG. 3 is a cross sectional view showing a memory cell and its periphery in the DRAM shown in FIGS. 1 and 2.

Memory cell MC is connected in the vicinity of a crossing point of sub bit line pair BLs, /BLs and word line WL. FIG. 3 is a cross sectional view showing a memory cell and its periphery in the DRAM shown in FIGS. 1 and 2.

Figure 18:
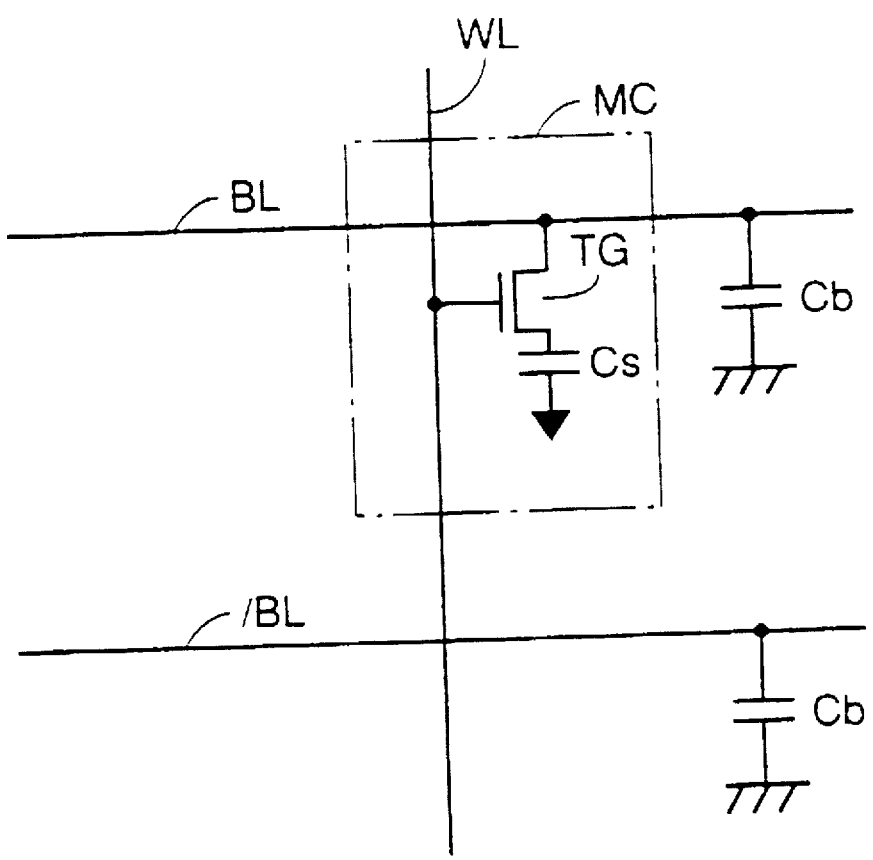
FIG. 18 is an interconnection diagram showing a memory cell and its periphery in the DRAM shown in FIGS. 16 and 17.

Referring to FIG. 3, as is the case with memory cell MC in the conventional DRAM in FIG. 18, memory cell MC is formed of one transfer gate TG and one memory cell capacitor CS. Transfer gate TG formed of an N channel MOS transistor has an N type source/drain region 16 connected to sub bit line BLs1, an N type drain region 18, and a gate electrode formed of word line WL1. Memory cell capacitor Cs is formed of a storage node 20 connected to one of the source/drain region 18 of transfer gate TG and a cell plate 22. Aluminum interconnections AL1 to AL3 are provided on word lines WL1 to WL3, respectively. Word lines WL1 to WL3 and aluminum interconnections AL1 to AL3 are connected through contact holes (not shown) at prescribed intervals.

Memory cell MC may be provided under a crossing point of sub bit line BLs or /BLs and word line WL. Such a memory cell MC is called cross point memory cell and disclosed for example in IEDM Technical Digest December, 1988 page 592.

Referring back to FIG. 1, 16 sub bit line pairs BLs, /BLs are arranged along one main bit line pair BLm, /BLm. 64 word lines WL1 to WL64 are arranged crossing one sub bit line pair BLs, /BLs.

These 64 word lines WL1 to WL64, n sub bit line pairs BLs1, /BLs1 to BLsn, /BLsn, 2×n transfer gates T1, /T1 to Tn, /Tn and 64×n memory cells MC constitute sub blocks Bs1 to Bs16. These 16 sub blocks BS1 to B16 constitute one main block Bm. Main block Bm corresponds to blocks B1 to B32 in the conventional DRAM shown in FIG. 16.

Referring back to FIG. 2, sub block select lines BS2 and BS3 for example are arranged along the direction of columns between word line WL64 in sub block Bs2 and word line WL1 in sub block Bs3. Sub block select lines BS2 and BS3 constitute the gate electrodes of transfer gates /T1 and/T2. One of the source/drain regions of these two transfer gate /T1 and/T2 are connected to main bit line /BLm1 through one contact hole 24. The other source/drain region of transfer gates /T1 and/T2 in sub block Bs2 is connected to sub bit line /BLs1 through a contact hole 26, and the other source/drain region of transfer gate /T1 in sub block Bs3 is connected to sub bit line /BLs1 through a contact hole 26.

One of the source/drain regions of two transfer gates /T2 are connected to main bit line /BLm2 through one contact hole 24. The other source/drain region of transfer gate /T2 in sub block Bs2 is connected to sub bit line /BLs2 in sub block Bs2 through a contact hole 26, and the other source/drain region of transfer gate /T2 in sub block Bs3 is connected to sub bit line /BLs2 in sub block Bs3 through a contact hole 26.

Therefore, these transfer gates /T1 and /T2 share one of the source/drain electrodes. Pairs of transfer gates T1, /T1 to Tn, /Tn provided between sub blocks Bs1 to Bs16 each share one of the source/drain electrodes.

Each pair of transfer gates T1, /T1 to Tn, /Tn sharing one of the source/drain electrodes forms a transistor pair. These transistor pair T1, /T1 to Tn, /Tn are arranged in a hound's tooth manner. More specifically, half of these transistor pairs T1, /T1 to Tn, /Tn forms a first group, and the remaining half forms a second group. The pitch of transistor pairs T1, /T1 to Tn, /Tn of the first and second groups is twice as wide as that of main bit lines BLm1 to BLmn and /BLm1 to /BLmn. The transistor pairs /T1 to /Tn of the second group are connected to main bit lines /BLm1 to /BLmn to which the transistor pairs T1 to Tn of the first group are not connected.

In the DRAM having such hierarchical bit line arrangement, since sub bit line BLs or/ BLs is surrounded by memory cell capacitors Cs, parasitic capacitance cbs per unit length thereof is very large. Main bit line BLm or /BLm is provided on memory cell MC and is not surrounded by a conductive layer, and therefore parasitic capacitance cbm per unit length thereof is very small.

For example, if sub bit line BLs, /BLs is formed of tungsten-silicide, and main bit line BLm, /BLm is formed of tungsten, its resistance is very small, and therefore main bit line BLm, /BLm can be formed into very thin, therefore parasitic capacitance of the main bit line can be smaller.

Now, operation of a DRAM having such hierarchical bit arrangement will be described.

When data is read out from memory cell MC in sub block Bs1, for example, sub block select line BS1 is pulled to H level, pairs of transfer gates T1, /T1 to Tn, /Tn in sub block Bs1 all conduct. At the time, the other sub block select line BS2 to BS16 are maintained at L level, and therefore pairs of transfer gates T1, /T1 to Tn, /Tn in sub blocks Bs2 to Bs16 are maintained in a non-conduction state.

Then, when one of word lines WL1 to WL64 in sub block Bs1 is pulled to H level, data is read out from memory cell MC connected to the word line to a corresponding one of sub bit lines BLs1 or /BLs1 to BLsn or /BLsn. The read out data is supplied to main bit line BLm1 or /BLm1 to BLmn or /BLmn through transfer gates T1 or /T1 to Tn or /Tn. Then the respective potential difference between one main bit lines BLm1 to BLmn and the other main bit lines /BLm1 to /BLmn are amplified by sense amplifiers SA1 to SAn.

Meanwhile, when data is written in memory cell MC in sub block Bs1, sub block select line BS1 in sub block Bs1 is pulled to H level, and transfer gates T1, /T1 to Tn, /Tn in sub block Bs1 conduct. Block select lines BS2 to BS16 in the other sub blocks Bs2 to Bs16 are maintained at L level, and transfer gates T1, /T1 to Tn, /Tn in sub blocks Bs2 to Bs16 are maintained in a non-conduction state.

Then, data externally applied through an input/output circuit (not shown) is supplied to main bit line pairs BLm1, /BLm1 to BLmn, /BLmn. The data is amplified by sense amplifiers SA1 to SAn.

Then, when one word line WL in sub block Bs1 rises to H level, the amplified data is written in memory cell MC connected to the word line WL through transfer gates T1, /T1 to Tn, /Tn and sub bit lines BLs1, /BLs1 to BLsn, /BLsn.

In the DRAM having the above-described hierarchical bit line arrangement, since main bit line pairs BLm, /BLm are formed long, the number of sense amplifier trains S is smaller than conventional. Accordingly, the size of the DRAM is smaller than conventional. Since more memory cells than conventional can be arranged in a smaller area, a DRAM having large storage capacity can readily be implemented.

Figure 16:
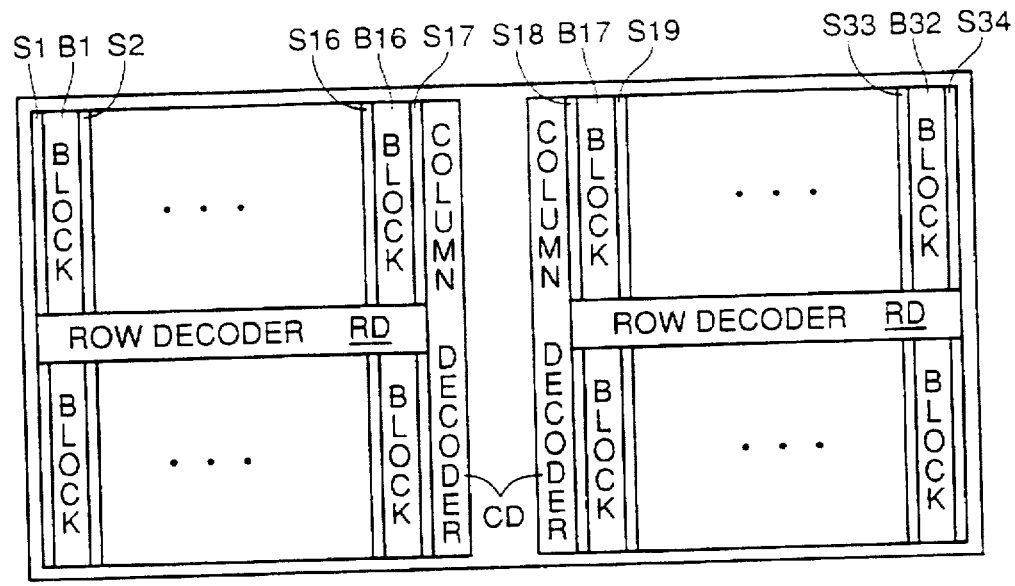
FIG. 16 is a block diagram showing the entire configuration of a conventional DRAM.
Figure 17:
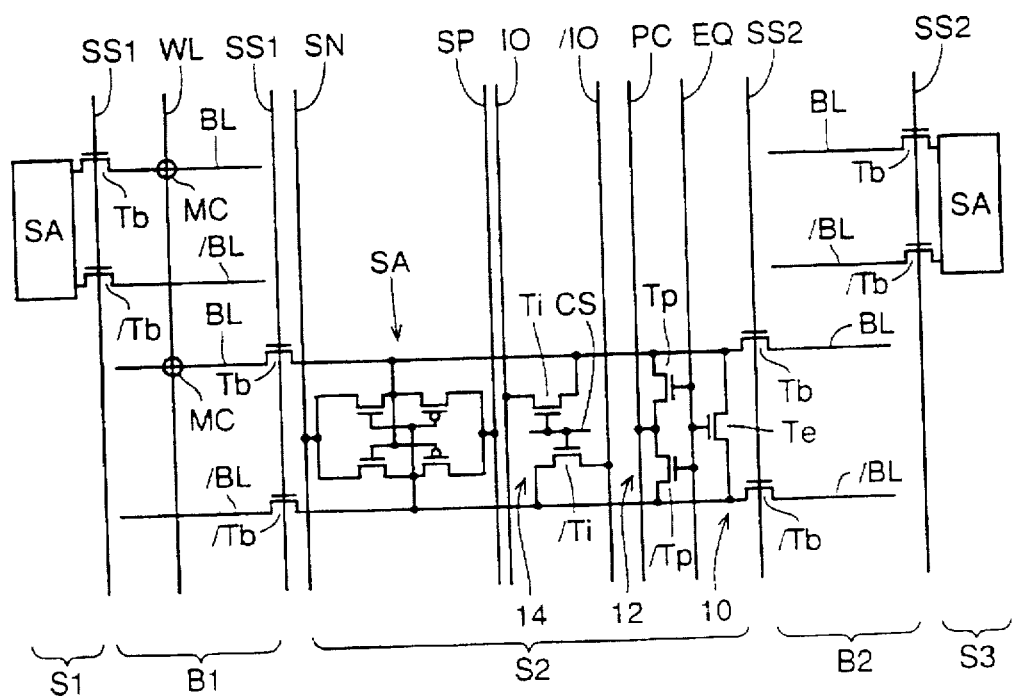
FIG. 17 is an interconnection diagram showing part of the conventional DRAM shown in FIG. 16.

The conventional 16M bit DRAM shown in FIG. 16 for example requires 34 sense amplifier trains S, while the DRAM of the above structure needs only 16 sense amplifier trains S. Accordingly, the length of the DRAM in the direction of rows is greatly shorter than conventional.

Furthermore, the parasitic capacitance cbm per unit length of main bit line pair BLm, /BLm is at most ¼ the parasitic capacitance cbs per unit length of sub bit line pair BLs, /BLs, and therefore sufficiently large potential difference is generated between main bit line pair BLm, /BLm at the time of data reading. Accordingly, sense amplifier SA can securely amplify the potential difference for accurate data reading.

Now, the reason for limiting the parasitic capacitance cbm per unit length of the main bit line pair to at most ¼ the parasitic capacitance cbs of the sub bit line pair will be described in more detail.

If the parasitic capacitance per unit length of a bit line pair in a conventional DRAM is cb, at the length of a bit line pair=1, the parasitic capacitance Cb of one bit line is given as follows:

$$Cb = cb \times 1 \tag{1}$$

In order to advantageously reduce the number of sense amplifier trains in a DRAM having hierarchical bit line arrangement, the length of main bit line pair BLm, /BLm must be at least twice the length of a conventional bit line pair. Meanwhile, the length of sub bit line pair BLs, /BLs should be shorter than the length of the conventional bit line pair or otherwise the total parasitic capacitance Cbt of the main bit line pair and the sub bit line pair will be larger than conventional. This is because sub bit line pair BLs, /BLs are always connected to main bit line pair BLm, /BLm. Generally in a DRAM, a memory cell MC is selected by a binary address, and therefore the number of memory cells connected to one sub bit line is $2^n$. Accordingly, the length of the sub bit line can only be $\frac{1}{2}^n$ of a conventional device. Accordingly, the length of sub bit line pair BLs, /BLs must be at most half the length of a conventional bit line pair.

Therefore, the total parasitic capacitance Cbt of main and sub bit line pairs in the DRAM is give as follows:

$$Cbt = cbs \times \frac{1}{2} + 2 \times cbm \times 1 \tag{2}$$

where the parasitic capacitance cbs per unit length of the sub bit line pair cannot be made smaller than the parasitic capacitance cb per unit length of the conventional bit line pair, and therefore the parasitic capacitance cbs per unit length of the sub bit line pair is equal to the parasitic capacitance cb per unit length of the conventional bit line pair.

In the DRAM, in order to produce sufficiently large potential difference between main bit lines BLm and /BLm, the following expression should be established:

$$Cbt \leq Cb \tag{3}$$

Substituting the above expressions (1) and (2) for expression (3) gives the following expression:

$$cbm \leq cbs/4 \tag{4}$$

As can be seen from expression (4), the parasitic capacitance cbm per unit length of the main bit line pair is preferably at most ¼ the parasitic capacitance cbs per unit length of the sub bit line pair. It is easy to reduce the parasitic capacitance cbm per unit length of the main bit line pair as described above, because main bit line pair BLm, /BLm is not surrounded by a conductive layer. The parasitic capacitance cbm per unit length of the main bit line pair needs only be at least ¼ the parasitic capacitance cbs per unit length of the sub bit line pair, or preferably smaller.

As described above, if the parasitic capacitance cbm per unit length of the main bit line pair is at least ¼ the parasitic capacitance cbs per unit length of the sub bit line pair, potential difference as large as conventional is generated between main bit line pair BLm, /BLm, and therefore sense amplifier SA can surely amplify the potential difference. Accordingly, a DRAM sized smaller than conventional and still having performance of the same level is implemented.

In addition since transfer gates T, /T are zigzagged by twos, the pitch of transfer gates is relaxed and the layout of these become less complicated.

Furthermore, since each transfer gate pair T, /T share one of the source/drain electrodes, the length of main block Bm may be reduced.

[Embodiment 2]

Figure 4:
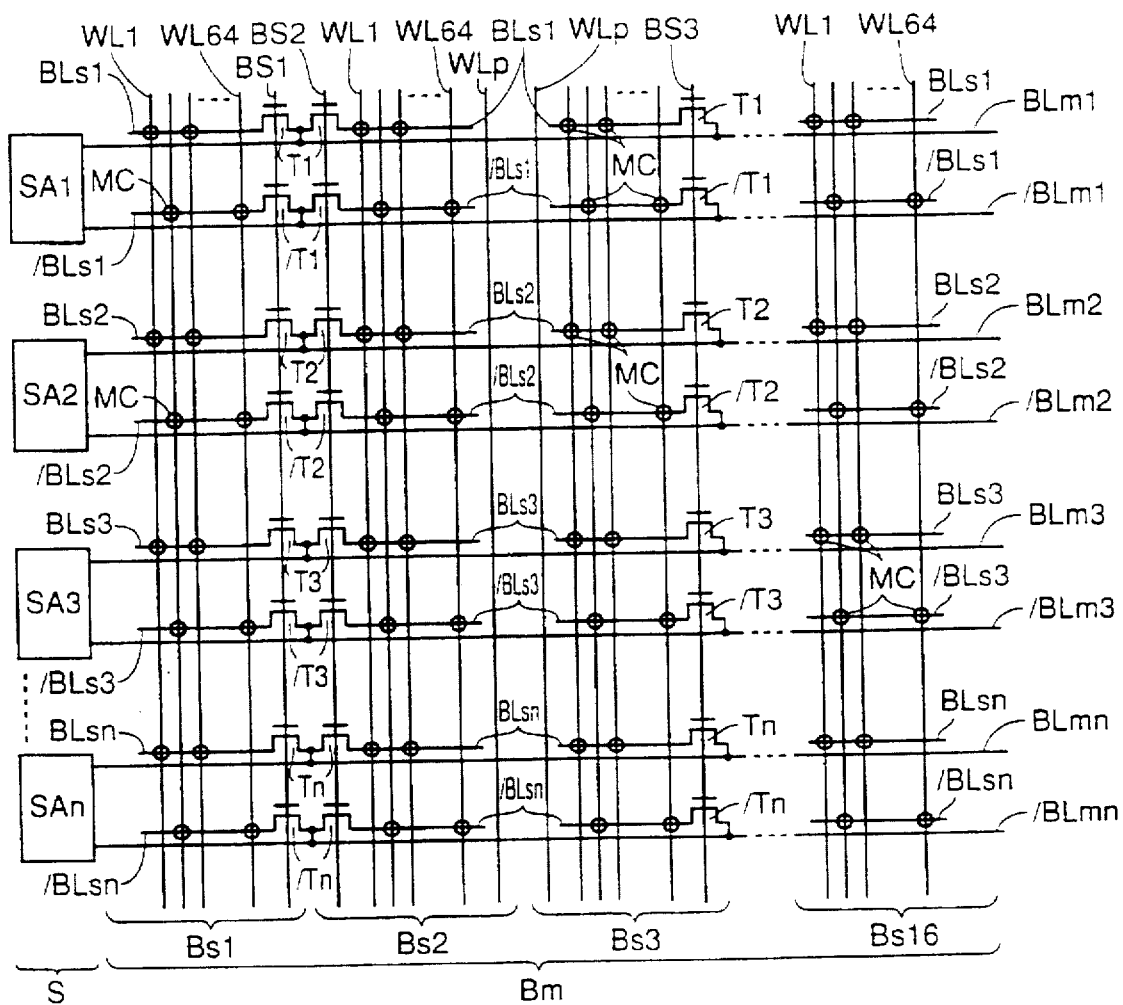
FIG. 4 is an interconnection diagram showing part of a DRAM according to Embodiment 2 of the present invention.

FIG. 4 is an interconnection diagram showing part of a DRAM according to Embodiment 2 of the present invention.

Referring to FIG. 4, the DRAM includes a plurality of main bit line pairs BLm, /BLm, a plurality of sense amplifiers SA, a plurality of word lines WL, a plurality of sub bit line pairs BLs, /BLs, a plurality of transfer gates T, a plurality of memory cells MC, and a plurality of dummy word lines WLp.

The parasitic capacitance cbm per unit length of main bit line pair BLm, /BLm is preferably ¼ the parasitic capacitance cbs per unit length of sub bit line pair BLs, /BLs, or more preferably smaller.

Embodiment 2 is different from the above Embodiment 1 in that transistor pairs formed of transfer gates T and /T are arranged in a hound's tooth manner in the above-described Embodiment 1, while they are arranged in a line along the direction of columns in Embodiment 2, and that two dummy word lines WLp are arranged between sub blocks Bs2 and Bs3.

In Embodiment 1, one sub bit line BLs is connected to one main bit line BLm through transfer gate T. The other sub bit line /BLs is connected to the other main bit line /BLm through transfer gate /T.

In Embodiment 2, since transfer gates T, /T are arranged in a line, and sub block select lines BS1, BS2, BS3 . . . are arranged in sub blocks Bs1 to Bs16 on a one-to-one basis, therefore the length along the rows is shorter than Embodiment 1.

The object, function and effect of dummy word line WLp will be described later in more detail in conjunction with Embodiment 10.

[Embodiment 3A]

Figure 5A:
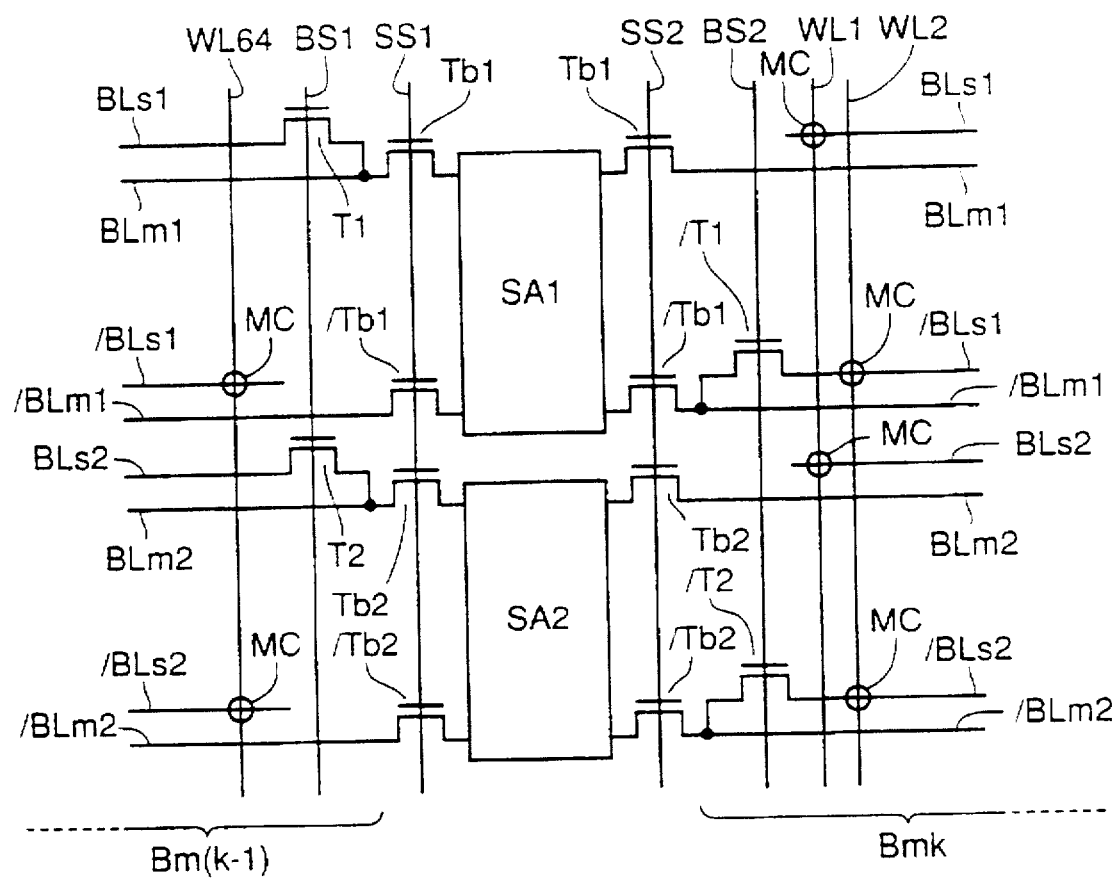
FIG. 5A is an interconnection diagram showing part of a DRAM according to Embodiment 3A of the present invention.

FIG. 5A is an interconnection diagram showing part of a DRAM according to Embodiment 3A of the present invention.

Referring to FIG. 5A, the DRAM includes a plurality of main bit line pairs BLm1, /BLm1, BLm2, /BLm2 . . . , a plurality of sense amplifiers SA1, SA2, . . . , a plurality of word lines WL1 to WL64, a plurality of sub bit line pairs BLs1, /BLs1, BLs2, /BLs2, . . ., transfer gates T1, /T1, T2, /T2 . . . for connecting the main bit line pairs and the sub bit line pairs, a plurality of memory cells MC, and a plurality of transfer gates Tb1, /Tb1, Tb2, /Tb2, . . . .

The parasitic capacitance cbm per unit length of main bit line pair BLm, /BLm is preferably ¼ the parasitic capacitance cbs per unit length of sub bit line pair BLs, /BLs, or more preferably smaller.

Embodiment 3A is different from Embodiment 1 in that the shared sense amplifier arrangement is employed. More specifically, on opposing sides of one sense amplifier SA1, SA2, . . . , two main bit line pairs BLm1, /BLm1 and BLm2, /BLm2, . . . are arranged. Transfer gates Tb1, /Tb1, Tb2, /Tb2, . . . are connected between main bit line pairs BLm1, /BLm1, BLm2, /BLm2, . . . on one side and sense amplifiers SA1, SA2, . . . . Transfer gates Tb1, /Tb1, Tb2, /Tb2 are connected between main bit line pairs BLm1, /BLm1, BLm2, /BLm2, . . . on the other side and sense amplifiers SA1, SA2, . . . .

Transfer gates Tb1, /Tb1, Tb2, and/Tb2 on the one side have gate electrodes connected together to one block select line SS1. Transfer gates Tb1, /Tb1, Tb2, /Tb2 on the other side have gate electrodes connected together to one block select line SS2.

These block select lines SS1 and SS2 are provided with complementary select signals. Accordingly, sense amplifiers SA1, SA2, . . . are each selectively connected with one of the two main bit line pairs BLm1, /BLm1, BLm2, /BLm2, . . . on the opposing sides, and amplify the potential difference between main bit line pairs BLm1, /BLm1, BLm2, /BLm2 . . . to which they are connected.

In Embodiment 3A, two transfer gates Tb1, /Tb1 on the left side for example forms a first transistor pair. The first transistor pair connects main bit line pair BLm1, /BLm1 on the left side and sense amplifier SA1 in response to a first select signal from block select line SS1. Two transfer gates Tb1 and /Tb1 on the right side forms a second transistor pair. The second transistor pair connects main bit line pair BLm1, /BLm1 on the right side and sense amplifier SA1 in response to a second select signal from block select line SS2. The second select signal is complementary to the first select signal.

In Embodiment 3A, since the two bit line pairs share one sense amplifier, and therefore the number of necessary amplifiers is reduced. Accordingly, the length of the DRAM along the rows is further reduced.

[Embodiment 3B]

Figure 5B:
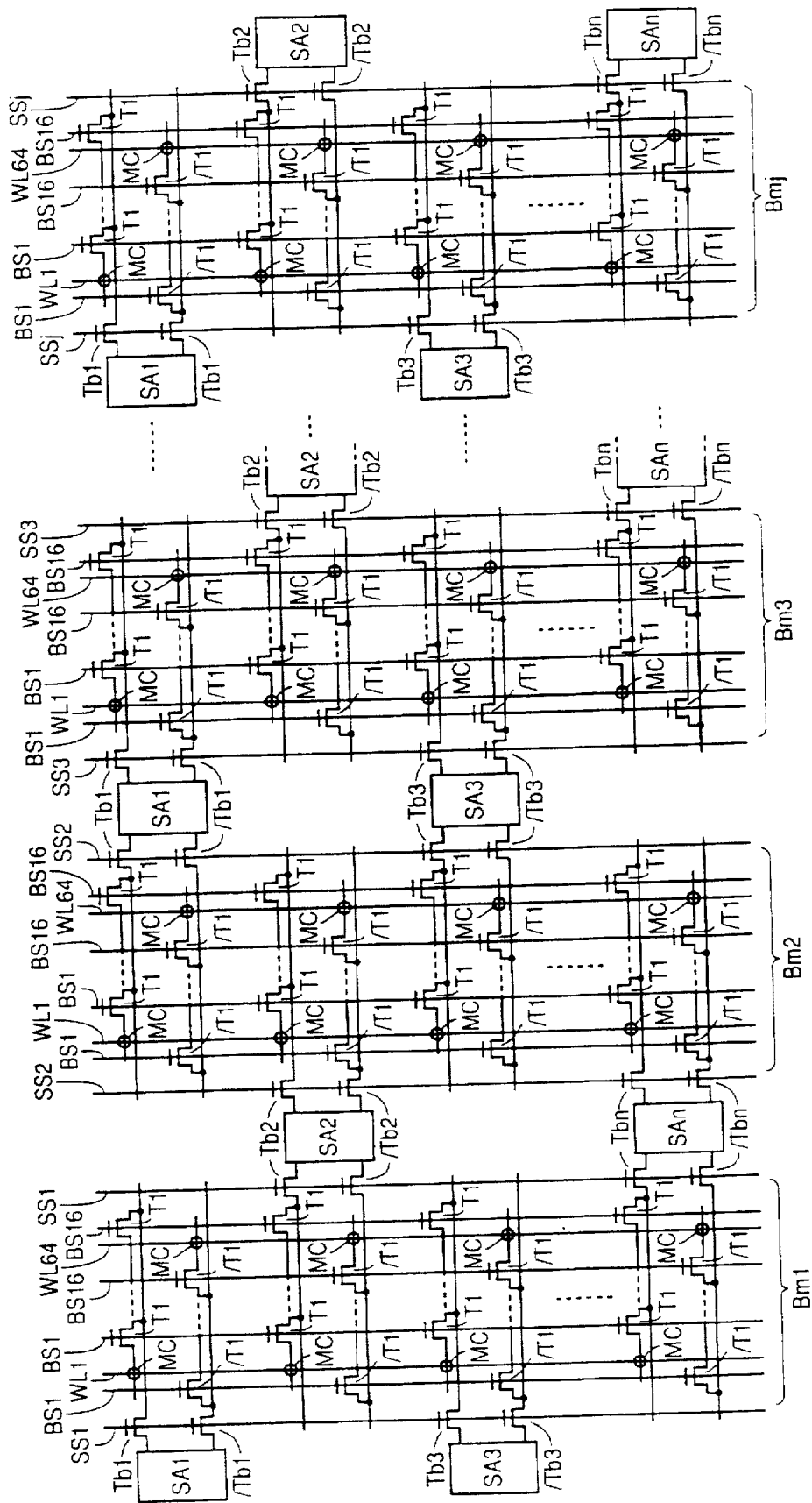
FIG. 5B is an interconnection diagram showing part of a DRAM according to Embodiment 3B of the present invention.

FIG. 5B is an interconnection diagram showing part of a DRAM according to Embodiment 3B of the present invention.

Referring to FIG. 5B, Embodiment 3B is different from Embodiment 3A described above in that shared sense amplifiers SA1, SA2, . . . are provided alternately to each other. According to Embodiment 3B, the pitch of sense amplifiers SA1, SA2, . . . in the column direction is wider than those in Embodiment 3A.

[Embodiment 4]

Figure 6:
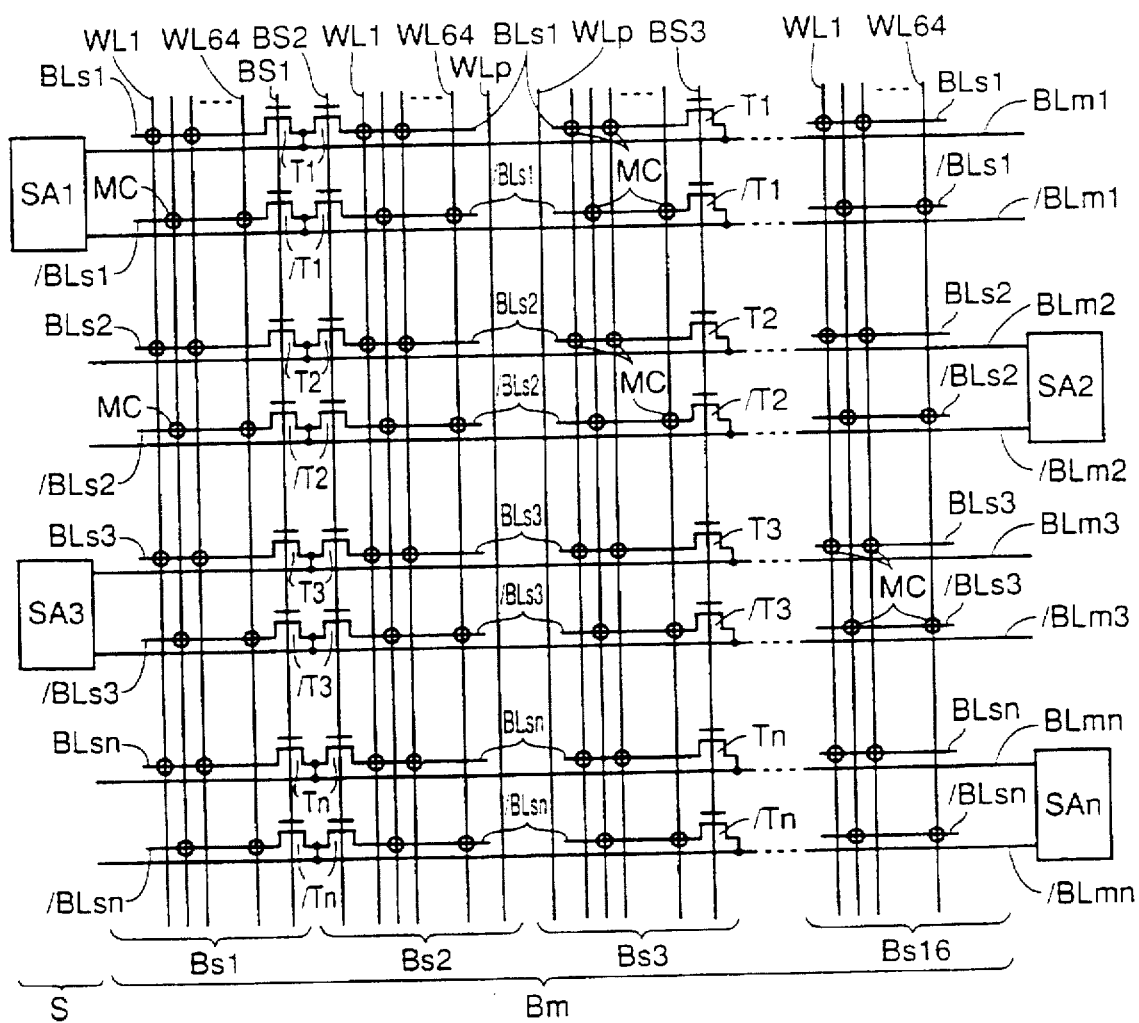
FIG. 6 is an interconnection diagram showing part of a DRAM according to Embodiment 4 of the present invention.

FIG. 6 is an interconnection diagram showing part of a DRAM according to Embodiment 4 of the present invention.

Referring to FIG. 6, the DRAM includes a plurality of main bit line pairs BLm, /BLm, a plurality of sense amplifiers SA, a plurality of word lines WL, a plurality of sub bit line pairs BLs, /BLs, a plurality of transfer gates T, /T connecting the main bit line pairs and the sub bit line pairs, a plurality of memory cells MC, and a dummy word line WLp. The parasitic capacitance cbm per unit length of main bit line pair BLm, /BLm is preferably ¼ the parasitic capacitance cbs per unit length of sub bit line pair BLs, /BLs, or more preferably smaller.

Embodiment 4 is different from Embodiment 2 in that sense amplifiers SA are alternately arranged. More specifically, half the plurality of sense amplifiers SA in the entire DRAM in Embodiment 4 constitutes a first group, and the remaining half a second group. Sense amplifiers SA of the first group are arranged for every two columns, and sense amplifiers SA of the second group are arranged every two columns on columns other than columns at which sense amplifiers SA of the first group are arranged.

In Embodiment 4, since sense amplifiers SA are arranged for every two columns, the pitch of sense amplifiers is wider than that according to Embodiment 2.

[Embodiment 5]

Figure 7:
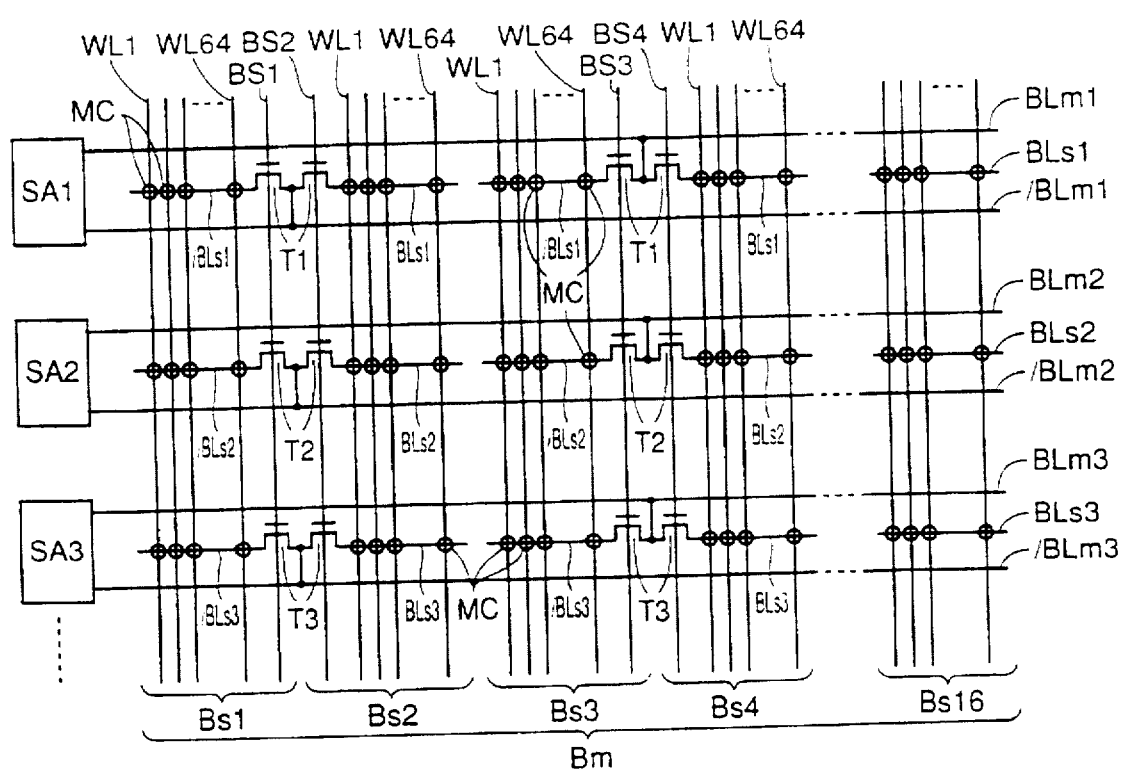
FIG. 7 is an interconnection diagram showing part of a DRAM according to Embodiment 5 of the present invention.

FIG. 7 is an interconnection diagram showing part of a DRAM according to Embodiment 5 of the present invention.

Referring to FIG. 7, the DRAM includes a plurality of main bit line pairs BLm, /BLm, a plurality of sense amplifiers SA, a plurality of word lines WL, a plurality of sub bit lines BLs, /BLs, a plurality of transfer gates T connecting the main bit line pairs and the sub bit line pairs, and memory cells MC. The parasitic capacitance cbm per unit length of main bit line pair BLm, /BLm is preferably ¼ the parasitic capacitance cbs per unit length of the sub bit line BLs, /BLs, or more preferably smaller.

Embodiment 5 is different from Embodiment 1 in that sub bit line pairs BLs, /BLs are arranged like a folded bit line, while in Embodiment 5, sub bit lines BLs, /BLs are arranged like open bit lines. Accordingly, memory cells are arranged at all the crossing points of sub bit lines BLs, /BLs and word lines WL.

If data is read out from memory cell MC in sub block Bs1, for example, sub block select line BS1 rises to H level. Thus, transfer gates T1, T2, T3, . . . in sub block Bs1 conduct, and sub bit line/BLs and one main bit line /BLm are connected. In this state, in response to a rising of word line WL to H level, data is read out from memory cell MC connected to that word line WL, and potential difference is generated between main bit line pair BLm and /BLm. The potential difference is amplified by sense amplifier SA.

In Embodiments 1 to 4, a sub bit line is arranged for every main bit line BLr, /Blm, while in Embodiment 5, a sub bit line is arranged for every two main bit lines BLr, /BLm, and therefore the DRAM according to Embodiment 5 may be manufactured more easily than the DRAM according to Embodiments 1 to 4.

[Embodiment 6]

Figure 8:
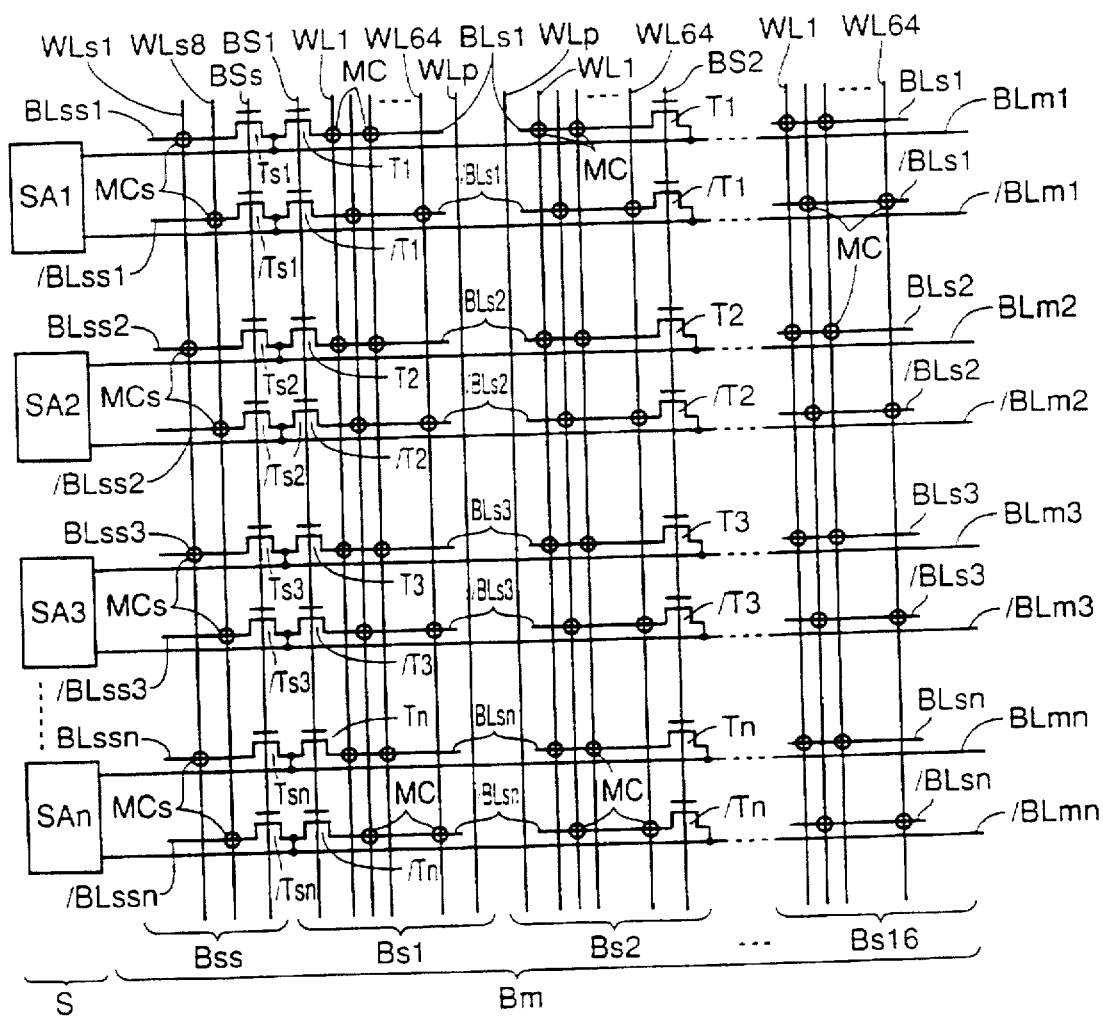
FIG. 8 is an interconnection diagram showing part of a DRAM according to Embodiment 6 of the present invention.

FIG. 8 is an interconnection diagram showing part of a DRAM according to Embodiment 6 of the present invention.

Referring to FIG. 8, as is the case with Embodiment 2 the DRAM includes a plurality of main bit line pairs BLm, /BLm, a plurality of sense amplifiers SA, a plurality of word lines WL, a plurality of sub bit line pairs BLs, /BLs, a plurality of transfer gates T, /T connecting the main bit line pairs and the sub bit line pairs, a plurality of memory cells MC, and a dummy word line WLp.

Unlike Embodiment 2, the DRAM further includes a plurality of spare word lines WLs, a plurality of spare sub bit line pairs BLss, /BLss, a plurality of spare transfer gates Ts, /Ts connecting the main bit line pairs and the spare sub bit line pairs, and a plurality of spare memory cells MCs.

Spare word lines WLs are arranged in rows. Spare sub bit line pairs BLss, /BLss are arranged in columns along main bit line pairs BLm, /BLm. Spare transfer gates Ts, /Ts connect one main bit line BLm, /BLm and one spare sub bit line BLss, /BLss. Spare memory cells MCs are arranged at or near crossing points of spare word lines WLs and spare sub bit line pairs BLss, /BLss.

A main block Bm in the DRAM is formed of 16 sub blocks Bs1 to Bs16, and one spare sub block Bss.

In each of regular sub blocks Bs1 to Bs16, 64 word lines WL1 to WL64 are arranged. In spare sub block Bss, 8 spare word lines WLs1 to WLs8 are arranged.

The parasitic capacitance cmb per unit length of main bit line pair BLm, /BLm is preferably ¼ the parasitic capacitance cbs per unit length of sub bit line pair BLs, /BLs, or more preferably smaller. Similarly, the parasitic capacitance cbm per unit length of main bit line pair BLm, /BLm is preferably ¼ the parasitic capacitance cbss per unit length of spare sub bit line pair BLss, /BLss, or more preferably smaller.

In the DRAM, if any of the word lines WL is defective, the defective word line WL is replaced with any spare word line WLs. More specifically, when the defective word line WL is accessed, the spare word line WLs is pulled to H level in place of the defective word line WL. At the time, since spare sub block select line BSs is also pulled to H level, at the time of data reading, data is read out from spare memory cell MCs connected to the spare word line WLs to main bit line pair BLm, /BLm through spare transfer gates Ts, /Ts. At the time of writing, data on main bit line pair BLm, /BLm is written into spare memory cell MCs through spare transfer gates Ts, /Ts and spare sub bit line pair BLss, /BLss.

Accordingly, when spare word line WLs is selected, the same amplifier SA as with the case in which regular word line WL is selected is activated. More specifically, when spare word line WLs is selected, sense amplifier SA different from the sense amplifier SA which is activated in selecting regular word line WL does not have to be activated, and therefore control of sense amplifiers SA would not be complicated.

If, the number of defective word lines among 1024 word lines WL is within 8, such defective word lines in any of sub blocks Bs1 to Bs16 may be replaced with spare word line WLs in spare sub block Bss. Accordingly, percentage of repairment for manufactured DRAMs increases.

[Embodiment 7]

Figure 9:
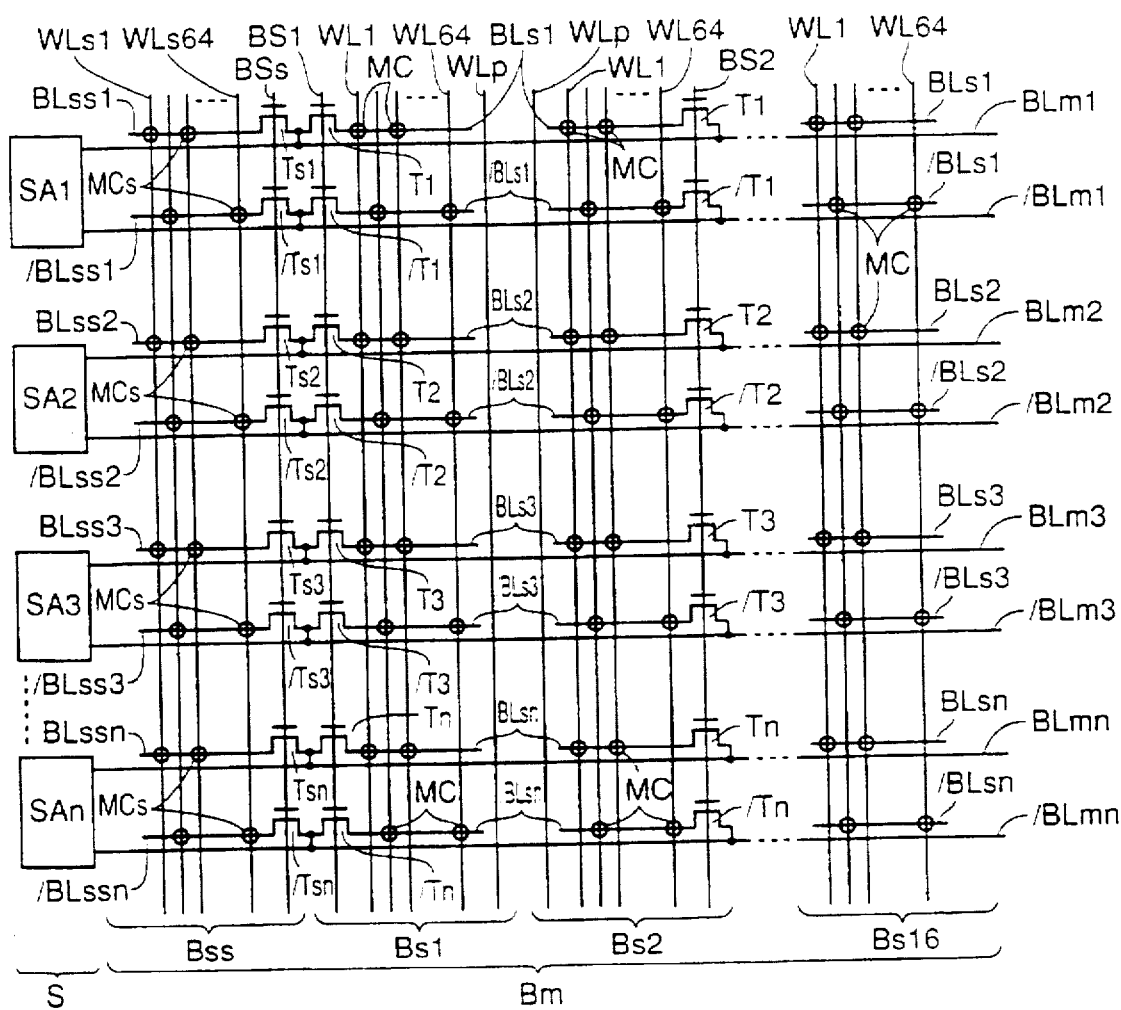
FIG. 9 is an interconnection diagram showing part of a DRAM according to Embodiment 7 of the present invention.

FIG. 9 is an interconnection diagram showing part of a DRAM according to Embodiment 7 of the present invention.

Referring to FIG. 9, the DRAM includes a plurality of main bit line pairs BLm, /BLm, a plurality of sense amplifiers SA, a plurality of word lines WL, a plurality of sub bit line pairs BLs, /BLs, a plurality of transfer gates T, /T each connecting one main bit line and one sub bit line in response to a control signal supplied from a sub block select line BS, and a plurality of memory cells MC.

The DRAM further includes a plurality of spare word lines WLs, a plurality of spare sub bit line pairs BLss, /BLss, a plurality of spare transfer gates Ts, /Ts each connecting one main bit line BLm or /BLm and one spare sub bit line BLss or /BLss, in response to a spare control signal from a spare sub block select line BSs, and a plurality of spare memory cells MCs.

Embodiment 7 is different from Embodiment 6 in that spare sub block Bss includes 64 spare word lines WLs1 to WLs64 as is the case with regular sub blocks Bs1 to Bs16.

Embodiment 6 cannot cope with the case in which a regular sub block Bs is entirely defective. In contrast, in Embodiment 7, if any of regular sub blocks Bs1 to Bs16 is defective, the defective sub block can be entirely replaced with a spare sub block Bss. Accordingly, percentage of repairment for a manufactured DRAM is further improved.

[Embodiment 8]

Figure 10:
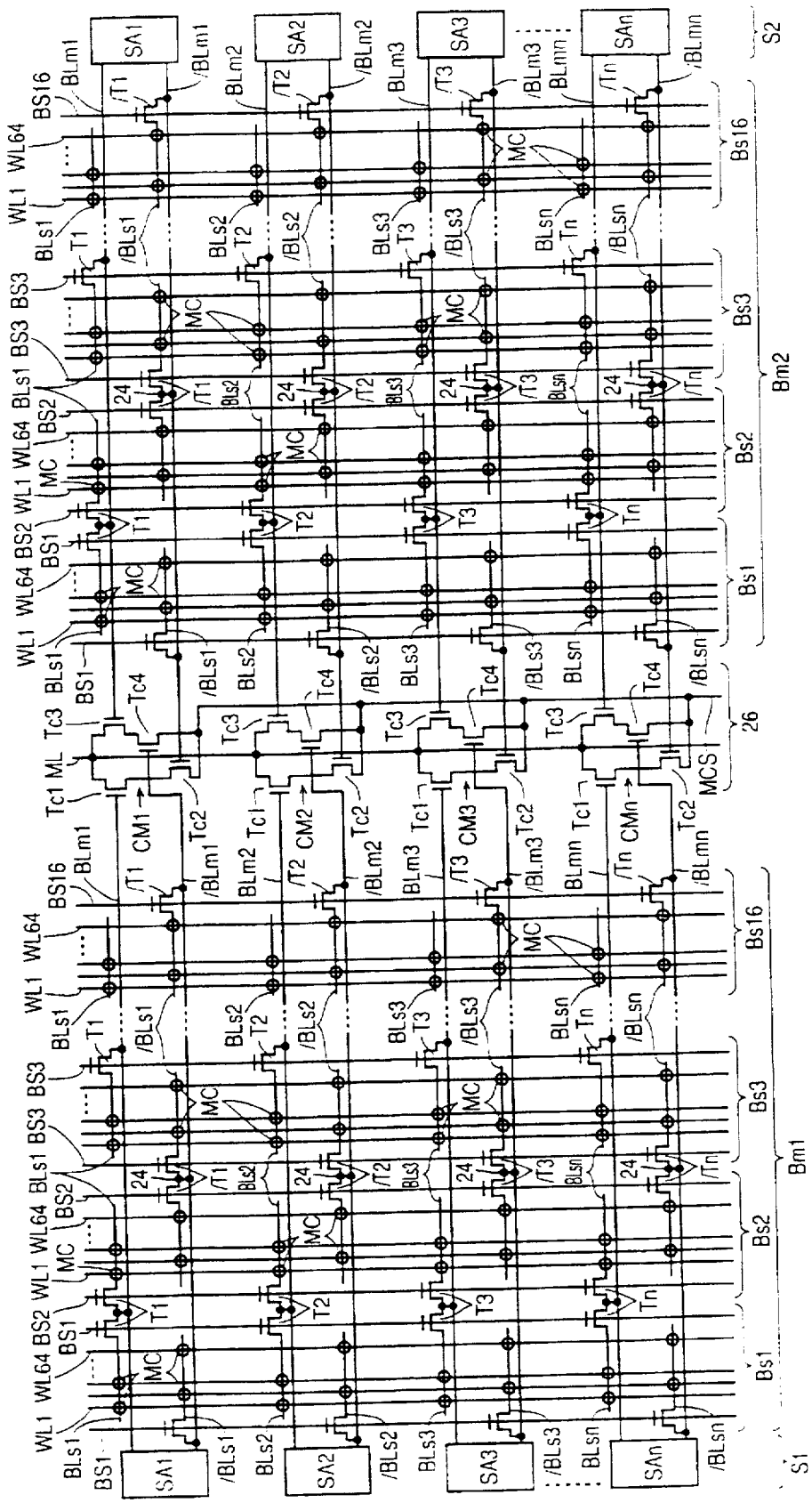
FIG. 10 is an interconnection diagram showing part of a DRAM according to Embodiment 8 of the present invention.

FIG. 10 is an interconnection diagram showing part of a DRAM according to Embodiment 8 of the present invention.

Referring to FIG. 10, the DRAM includes a plurality of main bit line pairs BLm, /BLm, a plurality of sense amplifiers SA, a plurality of word lines WL, a plurality of sub bit line pairs BLs, /BLs, transfer gates T, /T each connecting one main bit line and one sub bit line, a plurality of memory cells MC, and a test circuit 26.

Embodiment 8 is different from Embodiment 1 in that test circuit 26 is provided. Test circuit 26 is provided between main block Bm1 and main block Bm2 and formed of a wired exclusive OR circuit.

Test circuit 26 includes a plurality of comparison circuits CM1 to CMn. Each comparison circuit CM1 to CMn is formed of four N channel MOS transistors Tc1 to Tc4. The drain electrodes of transistors Tc1 and Tc3 in comparison circuits CM1 to CMn are connected together to a match line ML. The source electrodes of transistors Tc2 and Tc4 in comparison circuits CM1 to CMn are connected together to a common source line MCS.

When the DRAM is tested, the same data is correspondingly written to all the memory cells MC in main block Bm1 and all the memory cells MC in main block Bm2. For example, data written into memory cell MC connected to word line WL1 and sub bit line BLs1 in sub block Bs2 in main block Bm2 is written to memory cell MC connected to word line WL1 and sub bit line BLs1 in sub block Bs2 in main block Bm1.

Before data is read out from memory cell MC, match line ML is precharged to H level, and common source line MCS is supplied with H level.

Word lines WL at relative positions in main blocks Bm1 and Bm2 are activated, data is read out from corresponding memory cells MC to sub bit lines BLs. The read out data is amplified by sense amplifier SA.

Since the same data is correspondingly written to main blocks Bm1 and Bm2, if main blocks Bm1 and Bm2 both do not have any defect, transistors Tc1 and Tc3 in comparison circuits CM1 to CMn both conduct and transistors Tc2 and Tc4 are both turned off, or transistors Tc1 and Tc3 are both turned off and transistors Tc2 and Tc4 both conduct. Accordingly, match line ML and common source line MCS are maintained in a non-conduction state.

If a defect is present in main block Bm1 or Bm2, match line ML and common source line MCS conduct. Thus, when common source line MCS falls to L level, match line ML falls to L level as well.

More specifically, if each potential of main bit line pairs BLm, /BLm in main block Bm1 correspondingly matches each potential of main bit line pair BLm and /BLm in main block Bm2, match line ML is maintained at H level. If, however, any of main bit line pairs BLm and /BLm in main block Bm1 and corresponding main bit line pair BLm or /BLm in main block Bm2 do not correspondingly match in potential, match line ML is pulled to L level.

In the DRAM described above, memory cells MC connected to two word lines WL can be tested at a time, and therefore the entire DRAM can be quickly tested.

[Embodiment 9]

Figure 11:
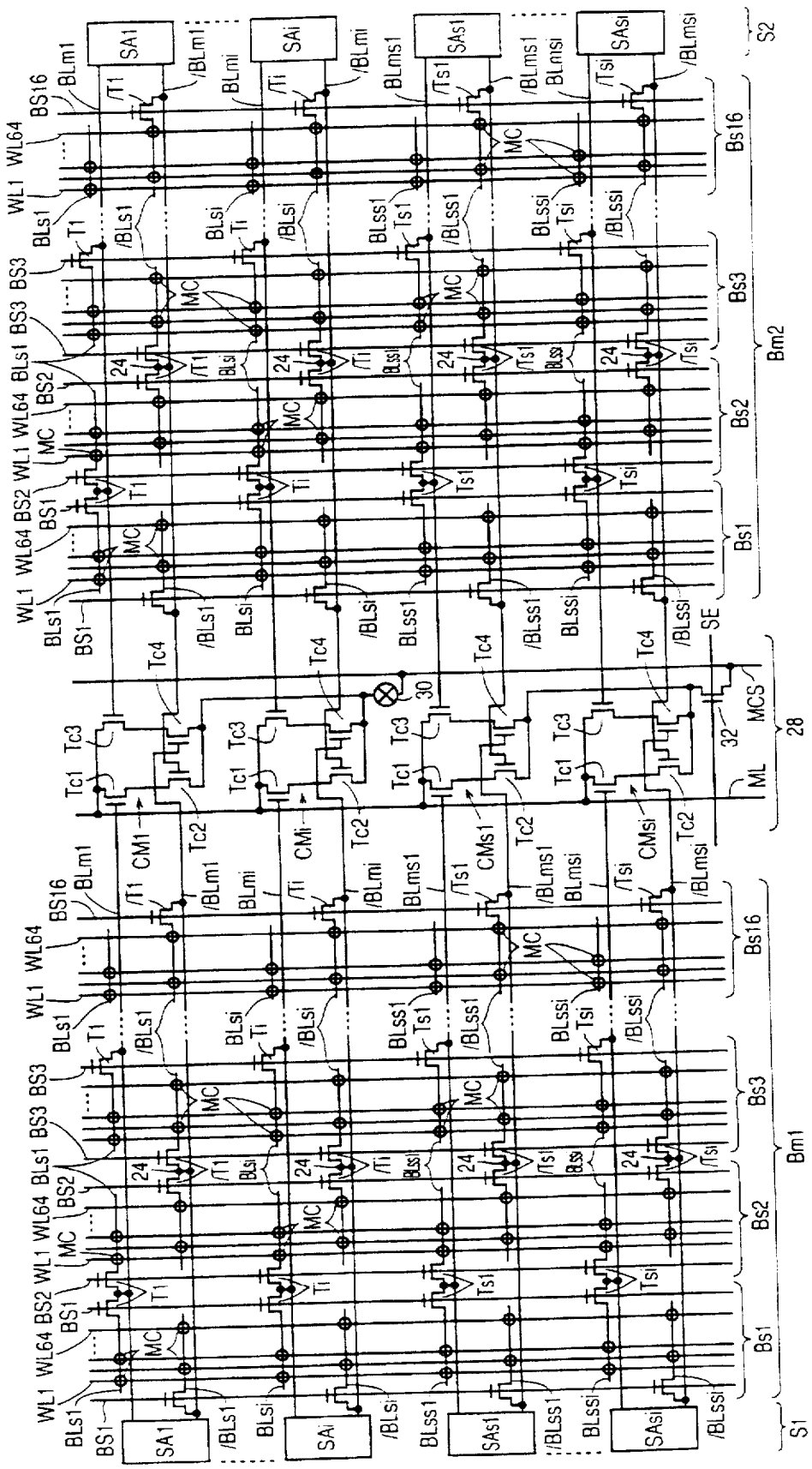
FIG. 11 is an interconnection diagram showing a test circuit in a DRAM according to Embodiment 9 of the present invention.

FIG. 11 is a diagram showing the configuration of a test circuit in a DRAM according to Embodiment 9 of the present invention.

Referring to FIG. 11, test circuit 28 includes a plurality of comparison circuits CM, and a plurality of spare comparison circuits CMs. Each comparison circuit CM is connected to two main bit line pairs BLm, /BLm provided on opposing sides thereof. Each spare comparison circuit CMs is connected to two spare main bit line pairs BLms, /BLms provided on opposing sides thereof. More specifically, the DRAM includes a redundant circuit provided along the direction of rows.

If, for example, main bit line pair BLm, /BLm has a defect, in place of main bit line pairs BLm1, /BLm1 to BLmi, /BLmi in i rows including that main bit line pair BLm, /BLm with the defect, spare main bit line pairs BLms1, /BLms1 to BLmsi, /BLmsi in i rows are activated in response to a select signal SE.

Test circuit 28 further includes a link element 30, and an N channel MOS transistor 32. Link element 30 is connected between the source electrodes of transistors Tc2 and Tc4 in i comparison circuits CM1 to CMi and common source line MCS. N channel MOS transistor 32 is connected between the source electrodes of transistors Tc2 and Tc4 in i spare comparison circuits CMs1 to CMsi and a common source line MCS. The source electrode of transistor 32 is supplied with select signal SE for activating the above-described redundant circuit.

When the DRAM is tested, and the redundant circuit is used, link element 30 connected to corresponding comparison circuits CM1 to CMi is disconnected.

Accordingly, when the DRAM is tested as is the case with Embodiment 8, test result data is not output from deactivated comparison circuits CM1 to CMi. Accordingly, the DRAM including the column redundant circuit can be accurately tested. Note that if such link element 30 is not provided, the row is always defective, and therefore match line ML is always at L level.

[Embodiment 10]

Figure 12:
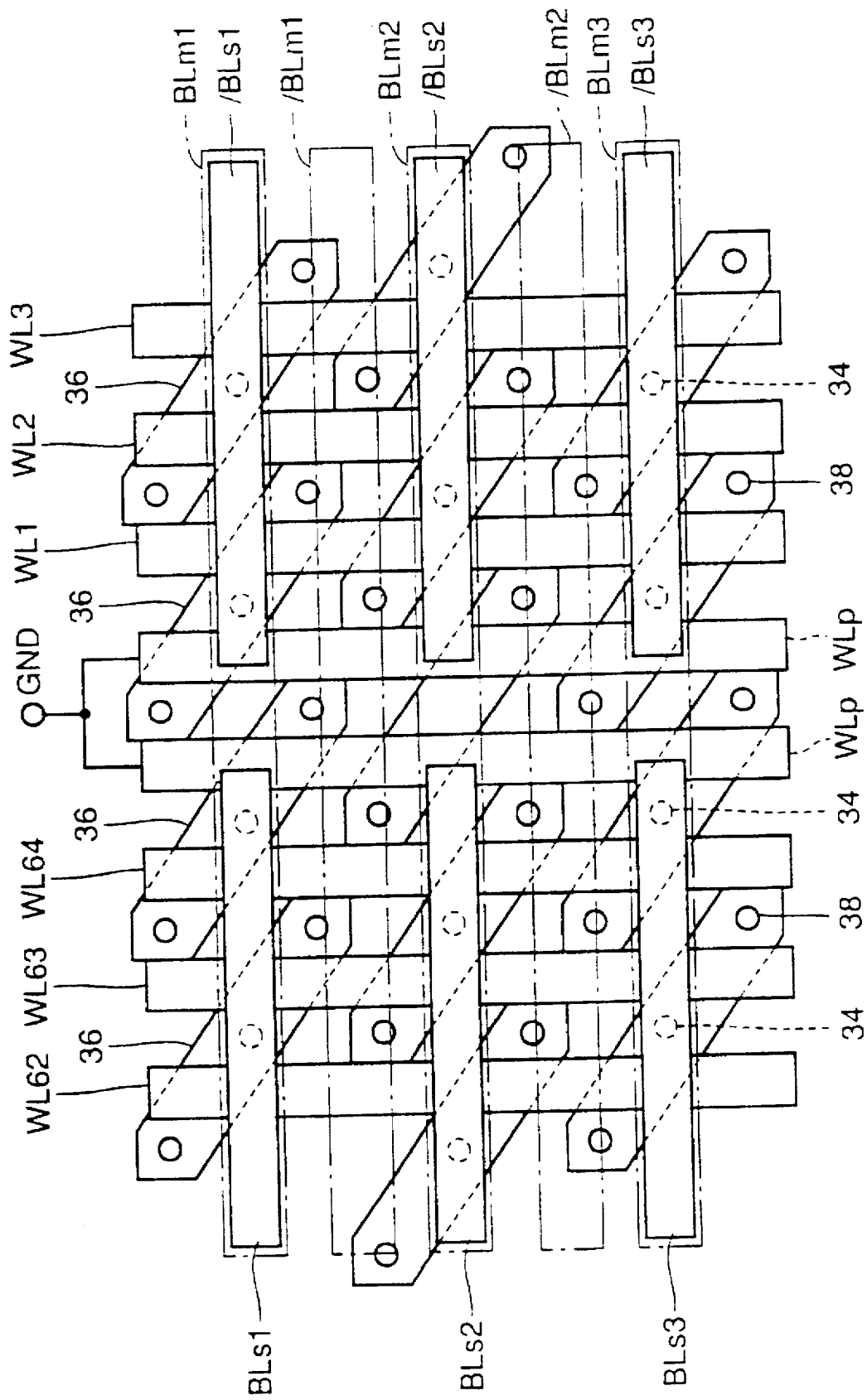
FIG. 12 is a plan view specifically showing part of a DRAM according to Embodiment 10 of the present invention.

FIG. 12 is a plan view showing part of the configuration of a DRAM according to Embodiment 10 of the present invention.

Embodiment 10 is an improved version of Embodiment 5. More specifically, in Embodiment 5, one end of one sub bit line BLs opposes one end of the other sub bit line /BLs, and therefore data generated on the one sub bit line BLs can slightly leak to the other sub bit line /BLs through a parasitic transistor therebetween.

Therefore, as illustrated in FIG. 12, two dummy word lines WLp are provided between one sub bit line BLs and the other sub bit line /BLs. These dummy word lines WLp are provided along the direction of columns between word line WL64 in the sub block on the left side and word line WL1 in the sub block on the right side. These dummy word lines WLp are supplied with ground potential GND.

Sub bit lines BLs, /BLs are connected to the field region 36 of the transfer gate through a contact hole 34. Field region 36 is connected to a memory cell capacitor (not shown) through a contact hole 38.

In the DRAM including dummy word lines WLp, since dummy word line WLp is supplied with ground potential GND, the parasitic transistor between sub bit lines BLs and /BLs is forced to a non conduction state. Accordingly, mutual data leakage does not occur between sub bit lines BLs and /BLs.

[Embodiment 11]

Figure 13:
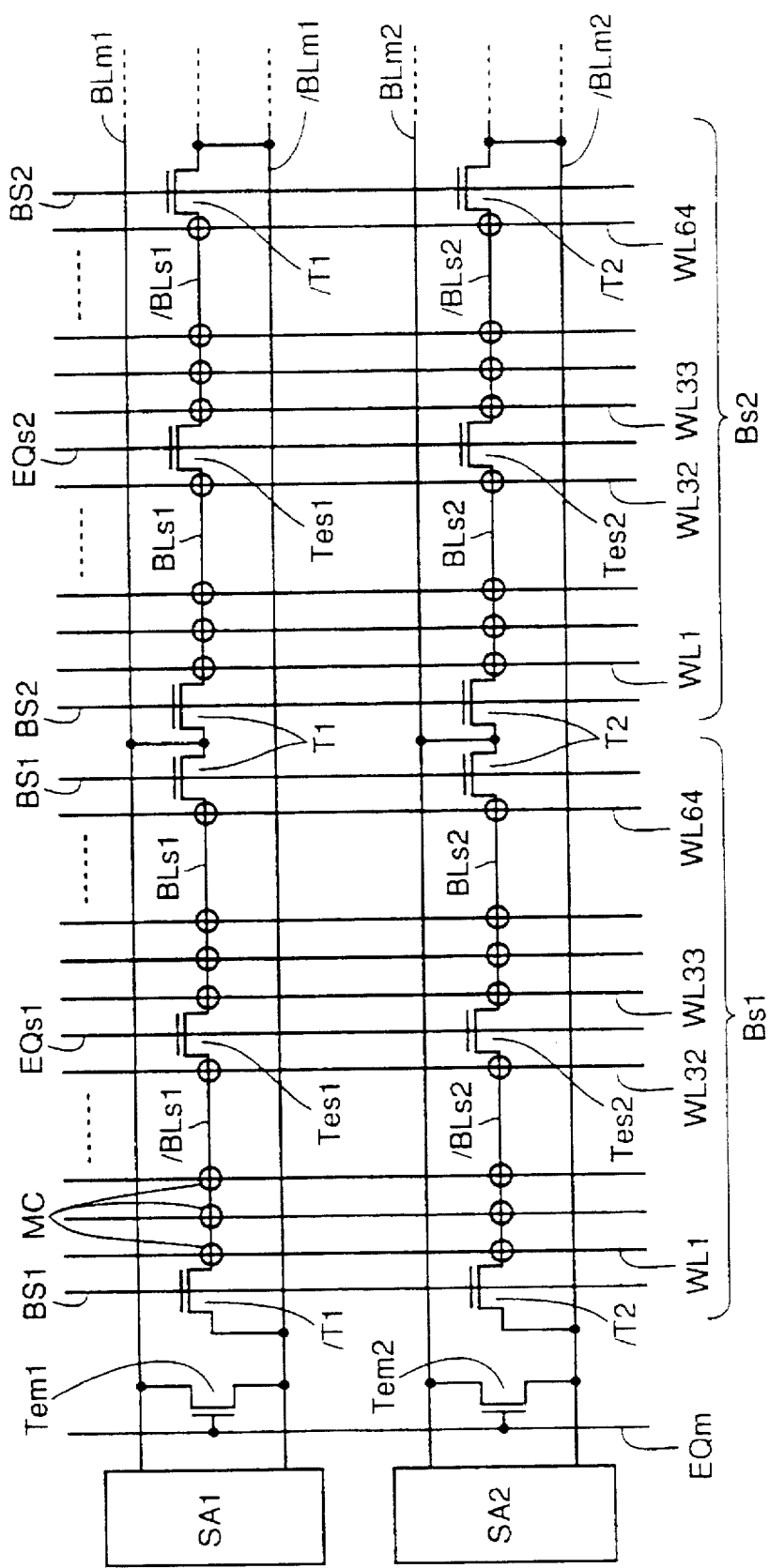
FIG. 13 is a diagram showing part of a DRAM according to Embodiment 11 of the present invention.
Figure 14:
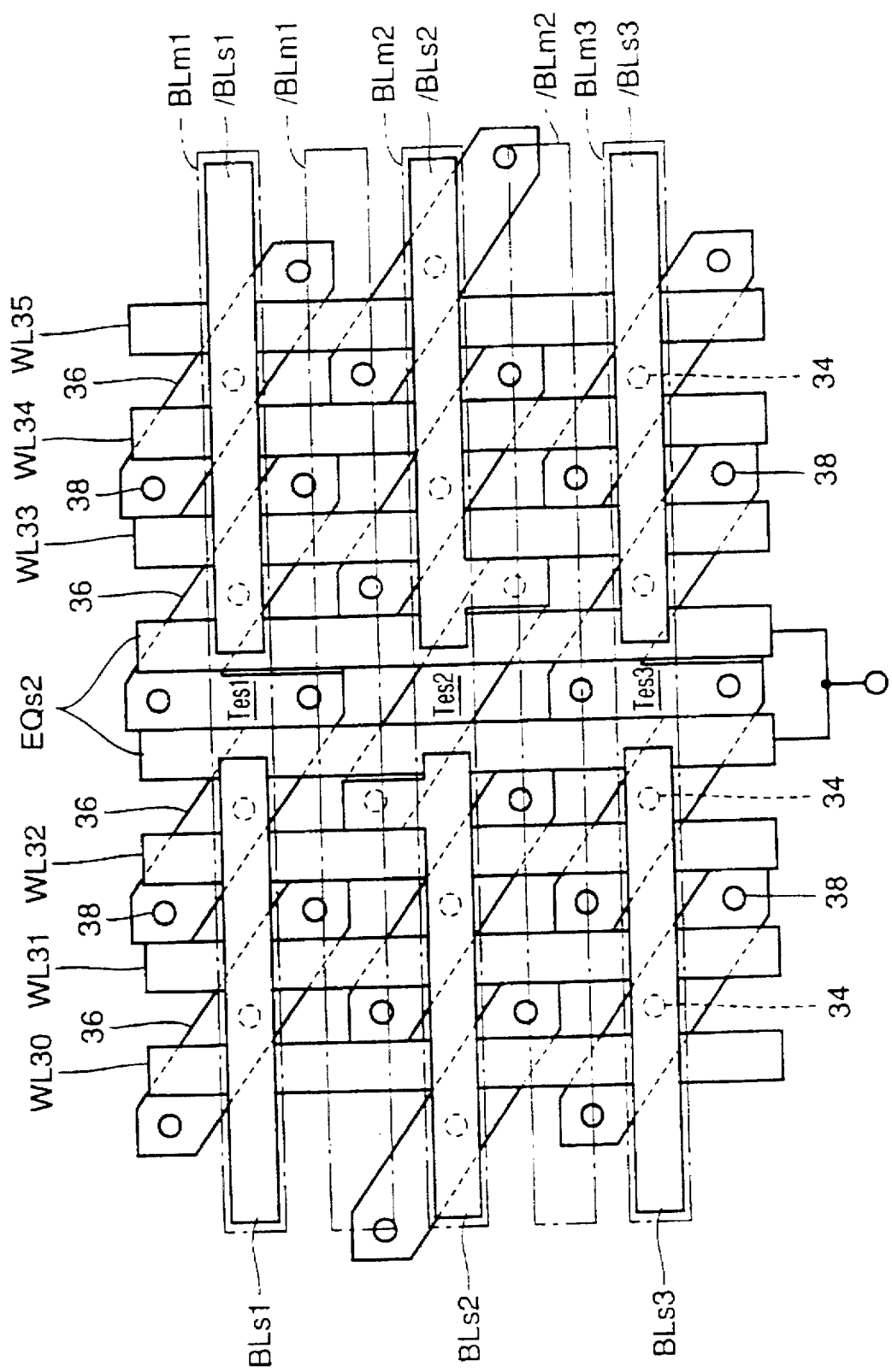
FIG. 14 is a plan view more specifically showing part of the DRAM shown in FIG. 13.

FIG. 13 is an interconnection diagram showing part of a DRAM according to Embodiment 11 of the present invention. FIG. 14 is a plan view specifically showing part of the DRAM in FIG. 13.

Referring to FIGS. 13 and 14, the DRAM includes a plurality of main bit line pairs BLm, /BLm, a plurality of sense amplifiers SA, a plurality of word lines WL, a plurality of sub bit line pairs BLs, /BLs, a plurality of transfer gates T, /T connecting main bit lines BLm, /BLm and sub bit lines BLs, /BLs, a plurality of memory cells MC, an N channel MOS transistor Tem for equalizing main bit line pair BLm, /BLm, and an N channel MOS transistor Tes for equalizing sub bit line pair BLs, /BLs.

What is the most characteristic about Embodiment 11 is the provision of N channel MOS transistor Tes for equalizing sub bit line pair BLs, /BLs. Though not shown, N channel MOS transistor Tem for equalizing main bit line pair BLm, /BLm is provided in Embodiments 1 to 10 in the same manner as Embodiment 11.

Referring to FIG. 14, transistors Tes for equalizing sub bit line pair are each provided between sub bit line pair BLs and /BLs, and two equalize lines EQs2 provided along the direction of columns form the gate electrodes of these transistors Tes.

Figure 15:
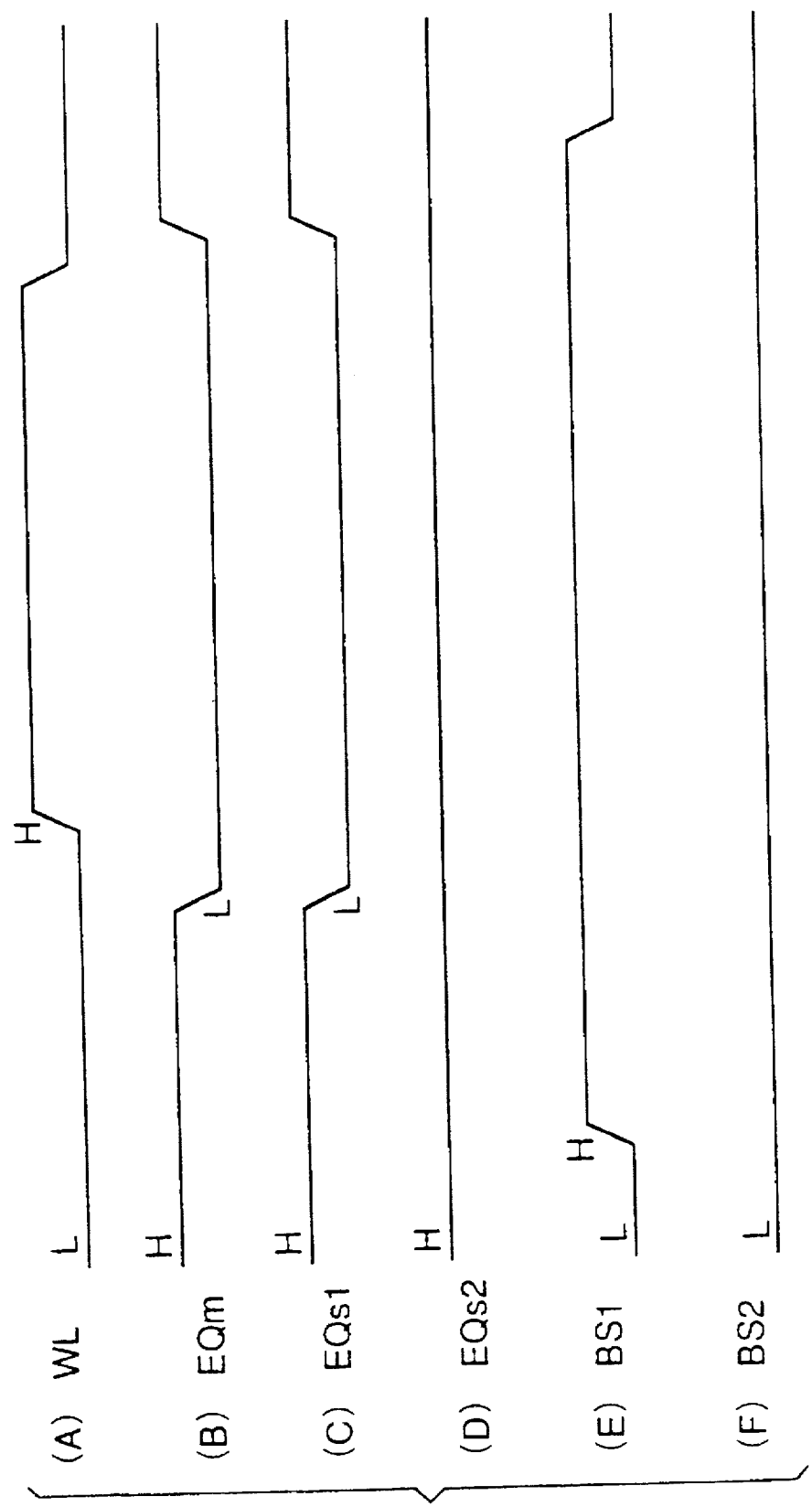
FIG. 15 is a timing chart for use in illustration of the operation of the DRAM shown in FIGS. 13 and 14.

FIG. 15 is a timing chart for use in illustration of operation of the DRAM shown in FIGS. 13 and 14.

As illustrated in FIG. 15 at (B), (C), and (D), equalize line EQm for main bit line, equalize lines Qs1 and Qs2 for sub bit line are both at H level. Accordingly, the potentials of main bit line pair BLm, /BLm and sub bit line pair BLs, /BLs are all equalized.

Then, as illustrated in FIG. 15 at (E), when sub block select line BS1 in sub block Bs1 rises to H level, sub bit line pair BLs and /BLs are connected to main bit line pair BLm and /BLm, respectively.

Then, as illustrated in FIG. 15 at (B) and (C), equalize line EQm for main bit line and equalize line EQs1 for sub bit line in sub block Bs1 fall to L level. At the time, equalize line EQs2 for sub bit line in sub block Bs2 is maintained at H level.

Then, as illustrated in FIG. 15 at (A), when any of word lines WL in sub block Bs1 rises to H level, data is read out from memory cell MC connected to the word line to sub bit line BLs, /BLs. The read data is read out to main bit line BLm or /BLm through corresponding transfer gates T1, T2, or /T1, /T2.

As described above, in the DRAM, since pair of sub bit lines BLs and /BLs are equalized before being connected to pair of main bit lines BLm and /BLm, the potentials of sub bit line pair BLs, /BLs are quickly equalized even if their lengths are long. Accordingly, time required for reading/writing of data will not be longer than conventional.

Except that pair of sub bit line BLs and /BLs are equalized, equalize line EQs forming the gate electrode is at L level, and therefore data does not leak between sub bit line pair BLs, /BLs as is the case with Embodiment 10 described above. Furthermore, since transistors Tes for equalizing sub bit line pairs are provided using spaces between regularly provided memory cells MC, and therefore no additional area for layout is necessary. In addition, transistors Tes can be formed without greatly changing the process of manufacture.

[Other Embodiments]

In the foregoing embodiments, the parasitic capacitance per unit length of a main bit line pair is at most ¼ the parasitic capacitance per unit length of a sub bit line pair, but the present invention is not limited to this.

Transfer gates connecting main bit line pairs and sub bit line pairs may be alternately provided in a DRAM having hierarchical bit line arrangement. In such a DRAM having hierarchical bit line arrangement, shared sense amplifier arrangement may be employed. Alternatively, in such a DRAM having hierarchical bit line arrangement, sense amplifiers may be alternately provided. In a DRAM having hierarchical bit line arrangement, all spare word lines may be provided in a spare sub block. Further in such a DRAM, the number of word lines in a regular sub block needs only be equal to the number of spare word lines in a spare sub block.

In a DRAM having hierarchical bit line arrangement, a test circuit may be provided between main blocks. Further in such a DRAM, redundant circuits may be provided along in columns with corresponding test circuits being provided, and a link element needs only be provided to a test circuit corresponding to the regular circuit.

Furthermore, in a DRAM having hierarchical bit line arrangement, dummy word lines may be provided along the direction of columns between sub bit line pairs. Equalize transistors dedicated to sub bit line pairs needs only be provided between the sub bit line pairs.

In other embodiments, for example in a DRAM having hierarchical bit line arrangement, transfer gates connecting main bit line pairs and sub bit line pairs may be alternately provided, the shared sense amplifier arrangement may be employed, and the sense amplifiers may be alternately provided, or alternatively the above-described embodiments may be combined for implementation as desired.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a hierarchical bit line arrangement, comprising:

first and second main memory cell blocks each having a plurality of sub memory cell blocks having a plurality of memory cells arranged in a plurality of columns and a plurality of rows, said plurality of rows being divided into said plurality of sub memory cell blocks;

a plurality of word lines arranged in said plurality of rows and connected to a plurality of memory cells arranged in corresponding rows;

a plurality of sub bit line pairs arranged in said plurality of columns corresponding to each of said plurality of sub memory cell blocks and connected to a plurality of memory cells arranged in corresponding columns in a corresponding sub memory cell block;

a plurality of main bit line pairs arranged in said plurality of columns;

a plurality of switching means pairs provided corresponding to said sub bit line pairs and each responsive to a select signal for connecting a corresponding sub bit line pair and a main bit line pair in a column in which the sub bit line pair is positioned;

a plurality of sense amplifier means provided corresponding to said plurality of main bit line pairs each for amplifying a potential difference appearing between the main bit lines of a corresponding main bit line pair; and a plurality of comparison means each provided corresponding to one of said plurality of columns of said first main memory cell block and one of said plurality of columns of said second main memory cell block for comparing the potentials of one main bit line pair arranged in the corresponding one column of said first main memory cell block and the potentials of one main bit line pair arranged in the corresponding one column of said second main memory cell block.

2. The semiconductor memory device as recited in claim 1, wherein each said main memory cell block further has a plurality of spare memory cells arranged in a plurality of spare columns and said plurality of rows, said semiconductor memory device further comprising:

a plurality of spare sub bit line pairs arranged in said plurality of spare columns corresponding to each of said plurality of sub memory cell blocks and connected to a plurality of spare memory cells arranged in corresponding spare columns;

a plurality of spare main bit line pairs arranged in said plurality of spare columns;

a plurality of spare switching means pairs provided corresponding to said spare sub bit line pairs and each responsive to a corresponding select signal for connecting a corresponding spare sub bit line pair and a spare main bit line pair in a spare column in which the spare sub bit line pair is positioned;

a plurality of spare sense amplifier means provided corresponding to said plurality of spare main bit line pairs each for amplifying a potential difference appearing between the spare main bit lines of a corresponding spare main bit line pair;

a plurality of spare comparison means each provided corresponding to one of said plurality of spare columns of said first main memory cell block and one of said plurality of spare columns of said second main memory cell block, for comparing the potentials of one spare main bit line pair arranged in the corresponding one spare column of said first main memory cell block and the potentials of one spare main bit line pair arranged in the corresponding one spare column of said second main memory cell block; and a plurality of deactivation means for deactivating some of said comparison means when redundant means including said spare memory cells, said spare sub bit line pairs, said spare main bit line pairs, said spare switching means pairs, said spare sense amplifier means, and said spare comparison means is activated.

3. A semiconductor memory device having a hierarchical bit line arrangement, comprising:

a main memory cell block having a plurality of sub memory cell blocks having a plurality of memory cells arranged in a plurality of columns and a plurality of rows, said plurality of rows being divided into said plurality of sub memory cell blocks;

a plurality of word lines arranged in said plurality of rows and connected to a plurality of memory cells arranged in corresponding rows;

a plurality of open sub bit line pairs arranged in said plurality of columns corresponding to each of said plurality of sub memory cell blocks and connected to a plurality of memory cells arranged in corresponding columns in a corresponding sub memory cell block;

a plurality of main bit line pairs arranged in said plurality of columns;

a plurality of switching means pairs provided corresponding to said plurality of open sub bit line pairs and each responsive to a select signal for connecting a corresponding open sub bit line pair and a main bit line pair in a column in which the open sub bit line pair is positioned;

a plurality of sense amplifier means provided corresponding to said plurality of main bit line pairs each for amplifying a potential difference appearing between the main bit lines of a corresponding main bit line pair; and a plurality of sub equalizing means each for connecting one sub bit line of a corresponding one open sub bit line pair among said plurality of open sub bit line pairs to the other open sub bit line.

4. The semiconductor memory device as recited in claim 3, further comprising:

a plurality of main equalizing means provided corresponding to said plurality of main bit line pairs each for connecting one main bit line of a corresponding main bit line pair to the other sub bit line.

* * * * *